(12) United States Patent
Sasago et al.

(10) Patent No.: US 11,855,106 B2
(45) Date of Patent: Dec. 26, 2023

(54) SIGNAL PROCESSING DEVICE HAVING COUNTER COUNTING PULSES FROM AVALANCHE PHOTODIODE

(71) Applicant: CANON KABUSHIKI KAISHA, Tokyo (JP)

(72) Inventors: Tomoya Sasago, Kanagawa (JP); Shintaro Maekawa, Kanagawa (JP); Yu Maehashi, Tokyo (JP); Yasuharu Ota, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/578,001

(22) Filed: Jan. 18, 2022

(65) Prior Publication Data

US 2022/0238574 A1    Jul. 28, 2022

(30) Foreign Application Priority Data

Jan. 22, 2021 (JP) .................. 2021-008584
Oct. 20, 2021 (JP) .................. 2021-171595

(51) Int. Cl.
*H01L 27/146* (2006.01)
*H04N 25/77* (2023.01)
*H01L 31/107* (2006.01)
*H01L 31/02* (2006.01)
*G01S 7/48* (2006.01)

(52) U.S. Cl.
CPC .. *H01L 27/14603* (2013.01); *H01L 27/14643* (2013.01); *H04N 25/77* (2023.01)

(58) Field of Classification Search
CPC .... H04N 25/77; H04N 25/772; H04N 25/773; H01L 27/14603; H01L 27/14643; H01L 29/0626; H01L 29/66113; H01L 29/7313; H01L 31/107; H01L 31/0203; G01S 7/4863; G01S 7/487
See application file for complete search history.

(56) References Cited

U.S. PATENT DOCUMENTS

| | | | |
|---|---|---|---|
| 10,868,982 B2* | 12/2020 | Koizumi | ........... H04N 25/79 |
| 10,903,386 B2* | 1/2021 | Haraguchi | ........... H04N 25/709 |
| 11,297,269 B2* | 4/2022 | Yasuda | ........... H04N 25/778 |
| 2008/0203309 A1 | 8/2008 | Frach et al. | |

(Continued)

FOREIGN PATENT DOCUMENTS

JP    2020150377 A    9/2020

*Primary Examiner* — Marly S Camargo
(74) *Attorney, Agent, or Firm* — CANON U.S.A., INC. IP Division

(57) ABSTRACT

A signal processing device includes a plurality of pixel signal processing units and a signal line group. The plurality of pixel signal processing units is arranged in a first direction and a second direction, each of the plurality of signal processing units acquiring a digital signal having a plurality of bits based on an output from a corresponding avalanche photodiode. The signal line group is arranged corresponding to the plurality of pixel signal processing units arranged in the first direction and including a signal line to which a plurality of signals corresponding to a plurality of bits of different digits of the digital signal held in each of the plurality of pixel signal processing units arranged in the first direction are commonly output.

27 Claims, 28 Drawing Sheets

(56) References Cited

U.S. PATENT DOCUMENTS

| | | | |
|---|---|---|---|
| 2015/0115131 A1* | 4/2015 | Webster | H01L 27/14634 |
| | | | 250/208.1 |
| 2020/0045251 A1* | 2/2020 | Koizumi | H04N 25/79 |
| 2021/0302551 A1* | 9/2021 | Kubota | G01S 7/487 |

* cited by examiner

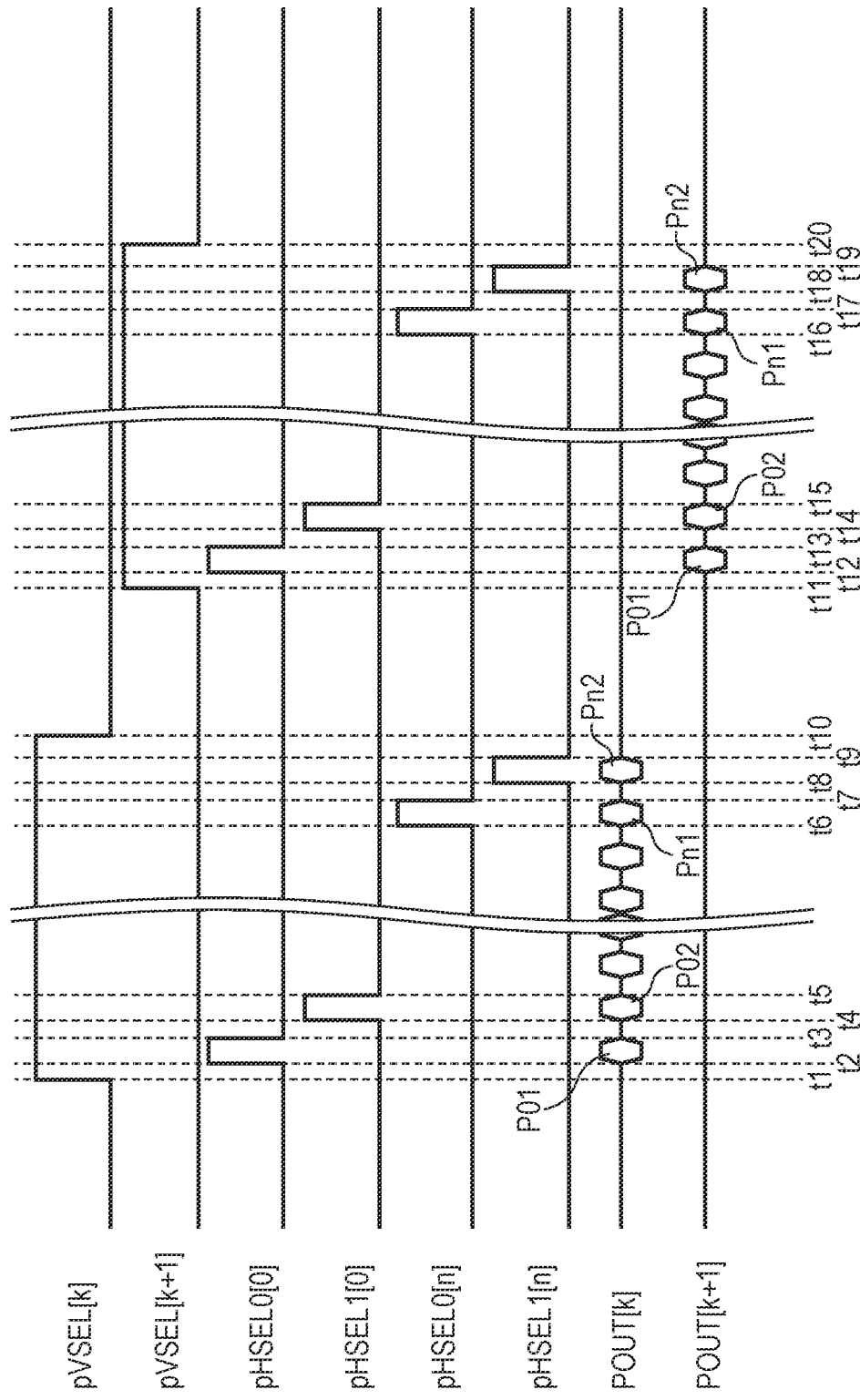

SIGNAL PROCESSING DEVICE HAVING COUNTER COUNTING PULSES FROM AVALANCHE PHOTODIODE

BACKGROUND

Technical Field

The present disclosure relates to a signal processing device.

Description of the Related Art

Japanese Patent Laid-Open No. 2020-150377 discloses an information processing device including a counter that counts the number of pulse signals generated in response to an incident photon. A counter disclosed in Japanese Patent Laid-Open No. 2020-150377 is a binary counter capable of acquiring a digital signal including a plurality of bits.

In some cases, a reduction in area for arranging wirings for outputting digital signals is required. However, Japanese Patent Laid-Open No. 2020-150377 does not investigate the output of a digital signal to a circuit subsequent to the counter.

SUMMARY

The present disclosure provides a signal processing device capable of reducing the area of wirings.

According to an aspect of the present disclosure, a signal processing device includes a plurality of pixel signal processing units and a signal line group. The plurality of pixel signal processing units is arranged in a first direction and a second direction. Each of the plurality of signal processing units acquires a digital signal having a plurality of bits based on an output from a corresponding avalanche photodiode. The signal line group is arranged corresponding to the plurality of pixel signal processing units arranged in the first direction and including a signal line to which a plurality of signals corresponding to a plurality of bits of different digits of the digital signal held in each of the plurality of pixel signal processing units arranged in the first direction are commonly output.

Further features of the present disclosure will become apparent from the following description of exemplary embodiments with reference to the attached drawings.

BRIEF DESCRIPTION OF THE DRAWINGS

FIG. 6 is a timing chart illustrating the operation of the pixel signal processing unit according to the first embodiment.

DESCRIPTION OF THE EMBODIMENTS

Figure 1:
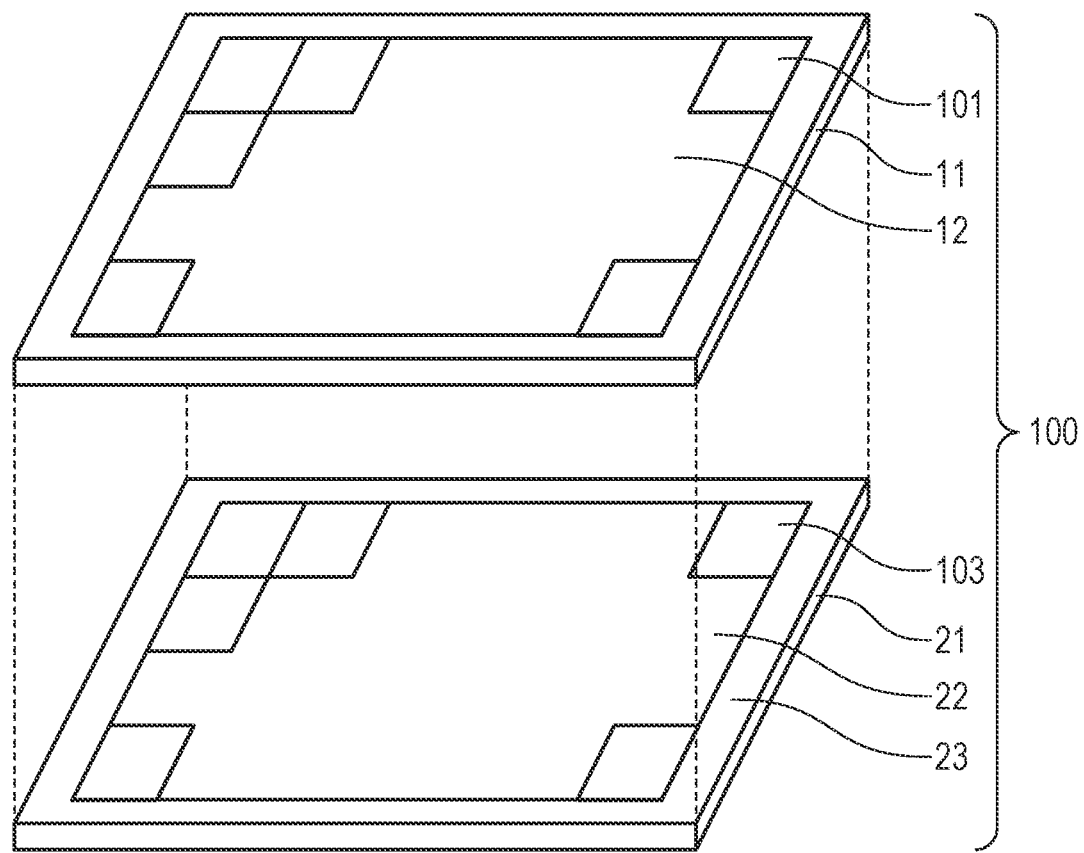
FIG. 1 is a schematic diagram illustrating a general configuration of a photoelectric conversion device according to a first embodiment.

Preferred embodiments of the present disclosure will now be described in detail in accordance with the accompanying drawings. The sizes and positional relationships of the members illustrated in the drawings may be exaggerated for clarity of description. In the drawings, the same or corresponding elements are denoted by the same reference numerals, and the description thereof may be omitted or simplified.

First Embodiment

FIG. 1 is a schematic diagram illustrating a general configuration of a photoelectric conversion device 100 according to the present embodiment. The photoelectric conversion device 100 may be, for example, a solid state imaging device, a focus detection device, a ranging device, a time-of-flight (TOF) camera, or the like. The photoelectric conversion device 100 includes a sensor substrate 11 (first substrate) and a circuit substrate 21 (second substrate) stacked on each other. The sensor substrate 11 and the circuit substrate 21 are electrically connected to each other. The sensor substrate 11 has a pixel area 12 in which a plurality of pixels 101 arranged in a plurality of rows and a plurality of columns are arranged. The circuit substrate 21 has a first circuit area 22 in which a plurality of pixel signal processing units 103 arranged in a plurality of rows and a plurality of columns are arranged, and a second circuit area 23 arranged on the outer periphery of the first circuit area 22. The second circuit area 23 may include a circuit for controlling the plurality of pixel signal processing units 103 or the like. The sensor substrate 11 has a light incident surface (first surface) for receiving incident light and a connecting surface (second surface) opposed to the light incident surface. The sensor substrate 11 is connected to the circuit substrate 21 on the side of connecting surface. That is, the photoelectric conversion device 100 is a so-called back-illuminated type.

In the present specification, "plan view" refers to viewing from a direction perpendicular to the light incident surface. The cross section refers to a surface in a direction perpendicular to the light incident surface of the sensor substrate 11. The light incident surface may be a coarse surface when viewed microscopically, but in this case, a plan view is defined with reference to the light incident surface when viewed macroscopically. In the present specification, the depth direction is a direction from the light incident surface toward the connecting surface.

In the following description, the sensor substrate 11 and the circuit substrate 21 are diced chips, but the sensor substrate 11 and the circuit substrate 21 are not limited to chips. For example, the sensor substrate 11 and the circuit substrate 21 may be wafers. In a case where the sensor substrate 11 and the circuit substrate 21 are diced chips, the photoelectric conversion device 100 may be manufactured by laminating them in a wafer level and then dicing them, or may be manufactured by laminating them after dicing.

Figure 2:
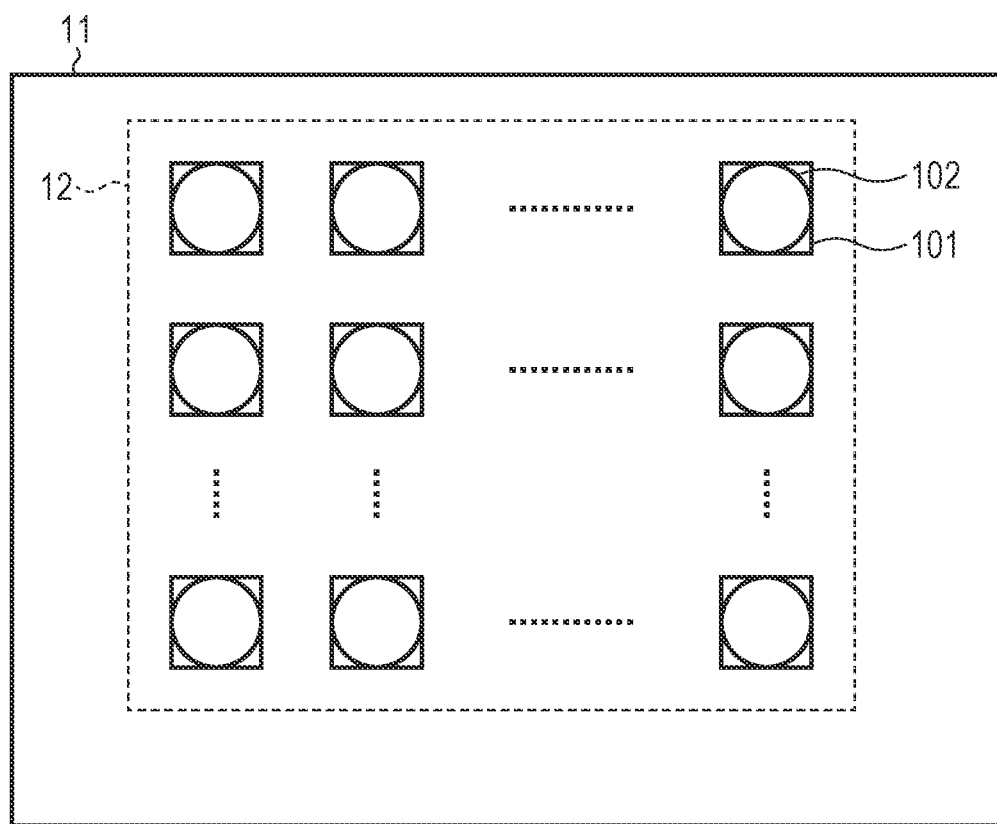
FIG. 2 is a schematic block diagram illustrating a configuration example of a sensor substrate according to the first embodiment.

FIG. 2 is a schematic block diagram illustrating a configuration example of the sensor substrate 11. In the pixel area 12, a plurality of pixels 101 arranged in a plurality of rows and a plurality of columns are arranged. Each of the plurality of pixels 101 includes a photoelectric conversion unit 102 including an avalanche photodiode (hereinafter referred to as APD) as a photoelectric conversion element. When the photoelectric conversion device 100 is an imaging device, the plurality of pixels 101 may be elements that generate a signal for an image by photoelectric conversion. However, when the photoelectric conversion device 100 is a ranging device using a technique such as TOF, the pixel 101 may be an element for measuring the time at which light reaches and the amount of light. That is, the application of the plurality of pixels 101 is not limited to acquisition of an image.

The conductivity type of charges used as signal charges among charge pairs generated in the APD is called a first conductivity type. The first conductivity type refers to a conductivity type in which a charge having the same polarity as the signal charge is used as a majority carrier. A conductivity type opposite to the first conductivity type is called a second conductivity type. Although an example in which the signal charge is an electron, the first conductivity type is an N-type, and the second conductivity type is a P-type will be described below, the signal charge may be a hole, the first conductivity type may be a P-type, and the second conductivity type may be an N-type.

Figure 3A:
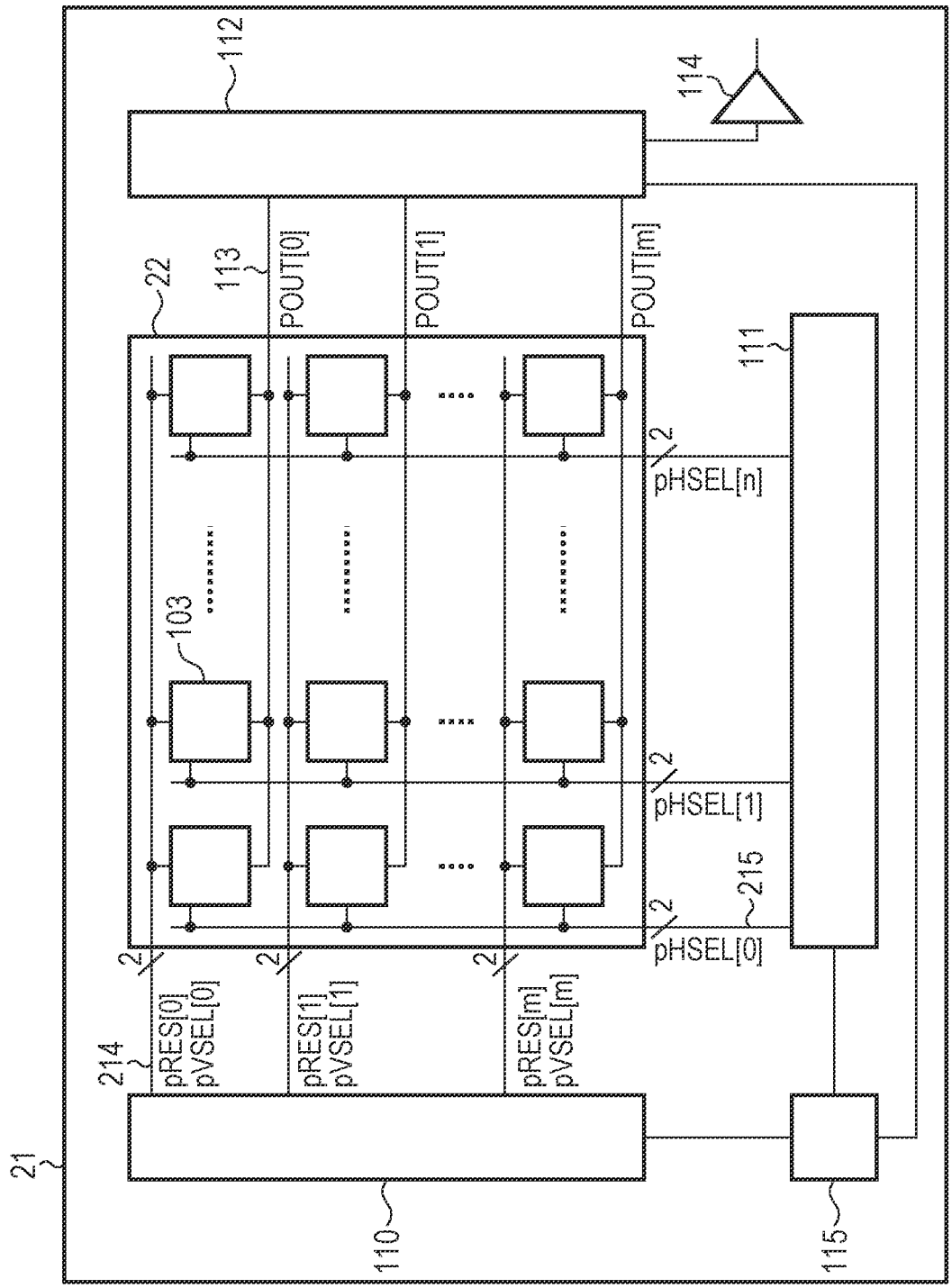
FIG. 3A is a schematic block diagram illustrating a configuration example of a circuit substrate according to the first embodiment.

FIG. 3A is a schematic block diagram illustrating a configuration example of the circuit substrate 21. The circuit substrate 21 has a first circuit area 22 in which a plurality of pixel signal processing units 103 arranged in a plurality of rows and a plurality of columns are arranged. In the following description, it is assumed that the plurality of pixel signal processing units 103 form (m+1) rows from the 0-th row to the m-th row and (n+1) columns from the 0-th column to the n-th column, but the number of rows and columns is not particularly limited. In this specification, a direction in which a plurality of pixel signal processing units 103 arranged in the same row are arranged (a horizontal direction in FIG. 3A) may be referred to as a first direction, and a direction in which a plurality of pixel signal processing units 103 arranged in the same column are arranged (a vertical direction in FIG. 3A) may be referred to as a second direction.

A vertical scanning circuit 110, a horizontal scanning circuit 111, a readout circuit 112, a pixel output signal line 113, an output circuit 114, a control signal generation unit 115, and driving lines 214 and 215 are arranged on the circuit substrate 21. The plurality of photoelectric conversion units 102 illustrated in FIG. 2 and the plurality of pixel signal processing units 103 illustrated in FIG. 3A are electrically connected to each other via connection wirings provided for the respective pixels 101.

The control signal generation unit 115 is a control circuit that generates control signals for driving the vertical scanning circuit 110, the horizontal scanning circuit 111, and the readout circuit 112, and supplies the control signals to the respective units. Thus, the control signal generation unit 115 controls the driving timing and the like of each unit.

The vertical scanning circuit 110 supplies a control signal to each of the plurality of pixel signal processing units 103 based on the control signal supplied from the control signal generation unit 115. As illustrated in FIG. 3A, the vertical scanning circuit 110 supplies control signals pRES and pVSEL for each row to each pixel signal processing unit 103 via two driving lines 214 provided for each row of the first circuit area 22. Note that in FIG. 3A and the like, an argument may be added after the name of the control signal, and this argument indicates a corresponding row or column number. Logic circuits such as shift registers and address decoders can be used for the vertical scanning circuit 110.

Thus, the vertical scanning circuit 110 selects a row from which a signal is output from the pixel signal processing unit 103.

The signal output from the photoelectric conversion unit 102 of the pixel 101 is processed in the pixel signal processing unit 103. The pixel signal processing unit 103 acquires and holds a digital signal having a plurality of bits by counting the number of pulses output from the APD included in the photoelectric conversion unit 102.

The horizontal scanning circuit 111 supplies a control signal to each of the plurality of pixel signal processing units 103 based on the control signal supplied from the control signal generation unit 115. As illustrated in FIG. 3A, the horizontal scanning circuit 111 supplies a control signal pHSEL for each column to each pixel signal processing unit 103 via a driving line 215 provided for each column of the first circuit area 22. Thus, the horizontal scanning circuit 111 selects a column to which a signal is output from the pixel signal processing unit 103. Note that a plurality of driving lines 215 may be provided for each column. In the present embodiment, as will be described later, two driving lines 215 are provided for each column.

The pixel output signal lines 113 are arranged to correspond to the respective rows of the plurality of pixel signal processing units 103. That is, the pixel output signal line 113 in one row is shared by the plurality of pixel signal processing units 103 in the corresponding row. The plurality of pixel signal processing units 103 in the column selected by the horizontal scanning circuit 111 output a signal POUT to the corresponding pixel output signal line 113. The signal POUT output to the pixel output signal line 113 is read to the readout circuit 112. The readout circuit 112 outputs the signal POUT to the storage unit or the signal processing unit outside the photoelectric conversion device 100 via the output circuit 114 based on the control signal supplied from the control signal generation unit 115. The pixel output signal line 113 corresponding to one row may be a signal line group including a plurality of signal lines.

The pixel signal processing unit 103 may not be provided for each of all the pixels 101. For example, one pixel signal processing unit 103 may be shared by a plurality of pixels 101. In this case, the pixel signal processing unit 103 provides a signal processing function to each pixel 101 by sequentially processing the signals output from the photoelectric conversion units 102.

As illustrated in FIGS. 2 and 3A, a first circuit area 22 in which a plurality of pixel signal processing units 103 are arranged is arranged in an area overlapping the pixel area 12 in a plan view. The vertical scanning circuit 110, the horizontal scanning circuit 111, the readout circuit 112, the output circuit 114, and the control signal generation unit 115 are arranged so as to overlap between the edge of the sensor substrate 11 and the edge of the pixel area 12 in the plan view. In other words, the sensor substrate 11 has the pixel area 12 and the non-pixel area arranged on the outer periphery of the pixel area 12. In the circuit substrate 21, a second circuit area 23 in which the vertical scanning circuit 110, the horizontal scanning circuit 111, the readout circuit 112, the output circuit 114, and the control signal generation unit 115 are arranged is arranged in an area overlapping the non-pixel area in the plan view.

Figure 3B:
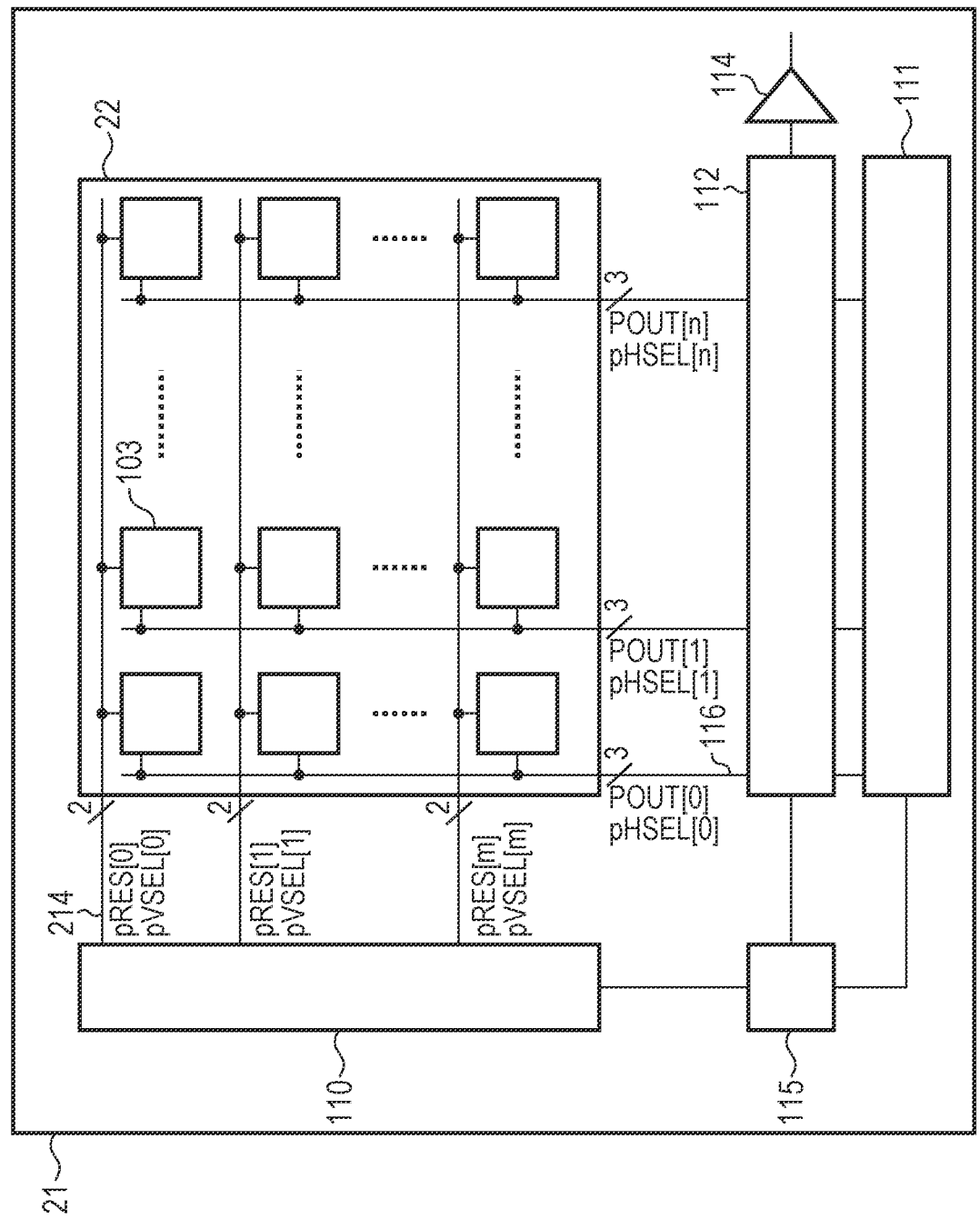
FIG. 3B is a schematic block diagram illustrating another configuration example of the circuit substrate according to the first embodiment.

FIG. 3B is a schematic block diagram illustrating another configuration example of the circuit substrate 21. The configuration of FIG. 3B is acquired by modifying a part of the configuration of FIG. 3A. Hereinafter, differences between FIGS. 3A and 3B will be described. In FIG. 3A, the pixel output signal lines 113 are arranged so as to correspond to the respective rows of the plurality of pixel signal processing units 103. In contrast, in FIG. 3B, the signal lines 116 are arranged so as to correspond to the respective columns of the plurality of pixel signal processing units 103. The signal line 116 includes a plurality of wirings, and has at least a function of outputting the signal POUT to the readout circuit 112 and a function of supplying the control signal pHSEL to the pixel signal processing unit 103. In other words, the signal line 116 has both the function of the pixel output signal line 113 and the function of the driving line 215 in FIG. 3A. In FIG. 3B, the configuration of other portions is the same as that in FIG. 3A, so that the description thereof will be omitted.

Also in the configuration of FIG. 3B, the same operation as the configuration of FIG. 3A is possible except that the signal reading direction is different. In the following description, it is assumed that the configuration of the circuit substrate 21 is as illustrated in FIG. 3A, but it is also applicable to the configuration of FIG. 3B by appropriately replacing the description.

Figure 4:
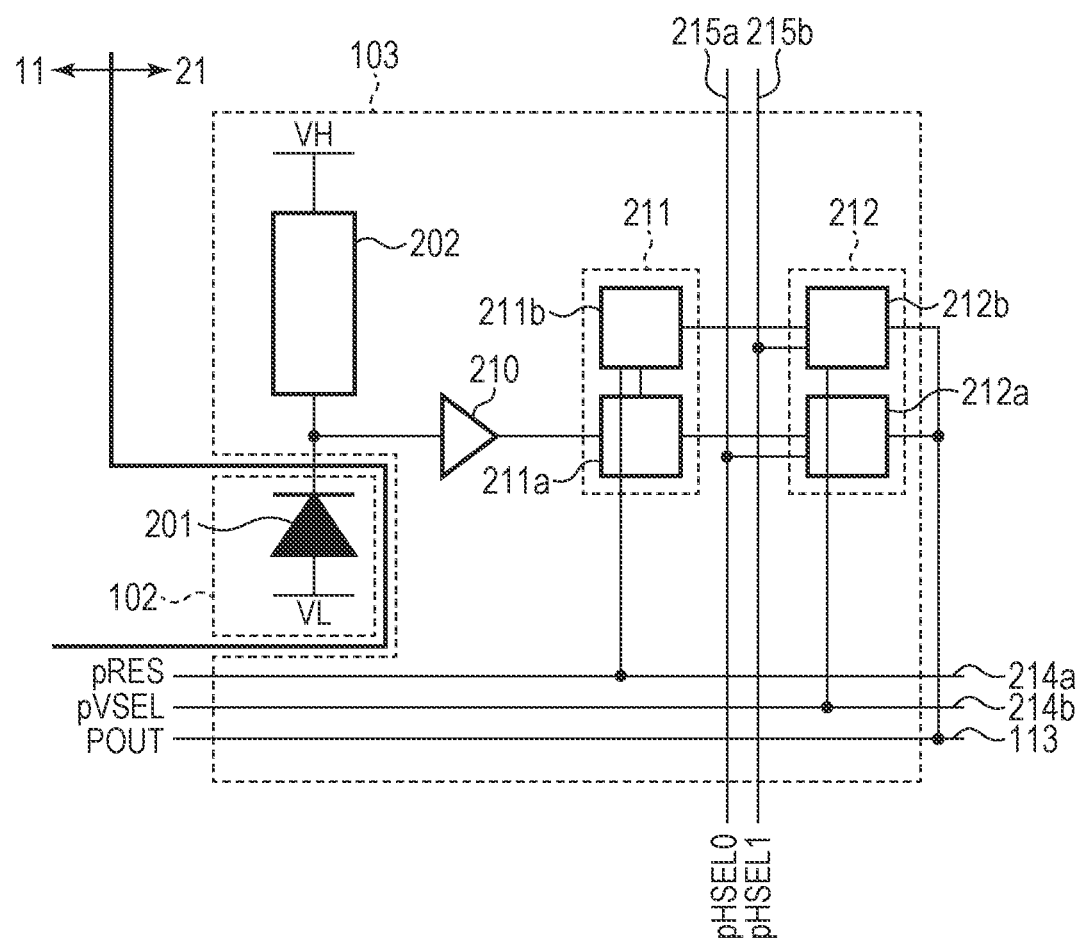
FIG. 4 is a schematic block diagram illustrating a configuration example of one pixel of the photoelectric conversion unit and the pixel signal processing unit according to the first embodiment.

FIG. 4 is a schematic block diagram illustrating a configuration example of one pixel of the photoelectric conversion unit 102 and the pixel signal processing unit 103 according to the present embodiment. FIG. 4 schematically illustrates a more specific configuration example including a connection relationship between the photoelectric conversion unit 102 arranged on the sensor substrate 11 and the pixel signal processing unit 103 arranged on the circuit substrate 21. In FIG. 4, the two driving lines 214 in FIG. 3A are illustrated as driving lines 214a and 214b, and the two driving lines 215 are illustrated as driving lines 215a and 215b.

The photoelectric conversion unit 102 includes an APD 201. The pixel signal processing unit 103 includes a quench element 202, a waveform shaping unit 210, a counter circuit 211, and a pixel output circuit 212. The counter circuit 211 includes a first memory 211a and a second memory 211b. The pixel output circuit 212 includes a first output circuit 212a and a second output circuit 212b. The pixel signal processing unit 103 may include at least one of the waveform shaping unit 210, the counter circuit 211, and the pixel output circuit 212.

The APD 201 generates charge pairs corresponding to incident light by photoelectric conversion. A voltage VL (first voltage) is supplied to the anode of the APD 201. The cathode of the APD 201 is connected to the first terminal of the quench element 202 and the input terminal of the waveform shaping unit 210. A voltage VH (second voltage) higher than the voltage VL supplied to the anode is supplied to the second terminal of the quench element 202. Thus, a reverse bias voltage is supplied to the anode and cathode of the APD 201 so that the APD 201 performs an avalanche multiplication operation. In the APD 201 to which the reverse bias voltage is supplied, when charges are generated by the incident light, the charges cause avalanche multiplication, and an avalanche current is generated.

Note that operation modes in the case where a reverse bias voltage is supplied to the APD 201 include a Geiger mode and a linear mode. The Geiger mode is a mode in which the anode and the cathode operate at a potential difference larger than the breakdown voltage, and the linear mode is a mode in which the anode and the cathode operate at a potential difference close to or lower than the breakdown voltage.

The APD operating in the Geiger mode is called a single photon avalanche diode (SPAD). The voltage at this time is, for example, voltage VL (first voltage) of −30 V and voltage VH (second voltage) of 1 V. The APD 201 may be operated in a linear mode or in a Geiger mode. In the case of SPAD, since the potential difference becomes large and the effect of avalanche multiplication becomes significant as compared with the APD in the linear mode, SPAD is preferable.

The quench element 202 functions as a load circuit (quench circuit) during signal multiplication by avalanche multiplication. The quench element 202 suppresses the voltage supplied to the APD 201 to suppress the avalanche multiplication (quenching operation). Further, the quench element 202 returns the voltage supplied to the APD 201 to the voltage VH by flowing a current corresponding to the voltage drop caused by the quenching operation (recharging operation). The quench element 202 may be, for example, a resistive element.

The waveform shaping unit 210 is a circuit that shapes a change in the potential of the cathode of the APD 201 acquired at the time of photodetection and outputs a pulse. For example, an inverter circuit is used as the waveform shaping unit 210. Although FIG. 4 illustrates an example in which one inverter is used as the waveform shaping unit 210, the waveform shaping unit 210 may be a circuit in which a plurality of inverters is connected in series or another circuit having a waveform shaping effect.

The counter circuit 211 counts the number of pulses output from the waveform shaping unit 210, and holds a digital signal indicating the count value. The first memory 211a and the second memory 211b of the counter circuit 211 hold the first bit and the second bit of the digital signal, respectively. When the control signal pRES is supplied via the driving line 214a, the counter circuit 211 resets the values held in the first memory 211a and the second memory 211b.

A control signal pVSEL is supplied to the pixel output circuit 212 from the vertical scanning circuit 110 illustrated in FIG. 3A via the driving line 214b illustrated in FIG. 4. Control signals pHSEL0 and pHSEL1 are supplied to the pixel output circuit 212 from the horizontal scanning circuit 111 illustrated in FIG. 3A via a plurality of driving lines 215a and 215b illustrated in FIG. 4, respectively. The control signal pHSEL in FIG. 3A includes both control signals pHSEL0 and pHSEL1. These control signals in FIG. 4 switch the electrical connection or disconnection between the counter circuit 211 and the pixel output signal line 113. The pixel output circuit 212 includes, for example, a buffer circuit for reading out values held in the first memory 211a and the second memory 211b and outputting signals corresponding to the held values.

The first output circuit 212a of the pixel output circuit 212 is configured to read the value of the first bit held in the first memory 211a based on the control signal pHSEL0 and output the read value to the pixel output signal line 113. The second output circuit 212b of the pixel output circuit 212 is configured to read the value of the second bit held in the second memory 211b based on the control signal pHSEL1 and output the read value to the pixel output signal line 113. That is, the pixel output signal line 113 is a common signal line for transmitting signals of the first bit and the second bit.

In the example of FIG. 4, the counter circuit 211 and the pixel output signal line 113 are electrically connected to each other or disconnected from each other in the pixel output circuit 212, but the method of controlling the signal output to the pixel output signal line 113 is not limited to this. For example, a switch such as a transistor may be arranged at a node between the quench element 202 and the APD 201, between the photoelectric conversion unit 102 and the pixel signal processing unit 103, or the like, and the signal output to the pixel output signal line 113 may be controlled by switching between electrical connection and disconnection. Alternatively, the signal output to the pixel output signal line 113 may be controlled by changing the value of the voltage VH or the voltage VL supplied to the photoelectric conversion unit 102 using a switch such as a transistor.

FIG. 4 illustrates a configuration example using the counter circuit 211. However, instead of the counter circuit 211, a time to digital converter (hereinafter, TDC) and a memory may be used to acquire the pulse detection timing. At this time, the generation timing of the pulse output from the waveform shaping unit 210 is converted into a digital signal by the TDC. In this case, the control signal pREF (reference signal) can be supplied to the TDC from the vertical scanning circuit 110 of FIG. 3A via the driving line. The TDC acquires, as a digital signal, a signal indicating the relative time of the input timing of the pulse based on the control signal pREF.

Figure 5A:
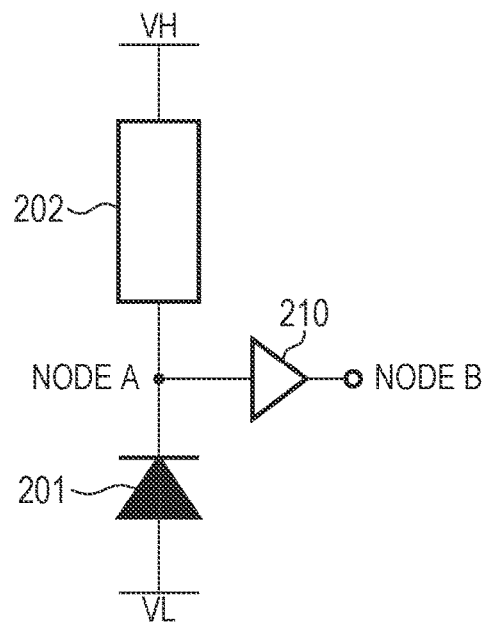
FIGS. 5A, 5B, and 5C are diagrams illustrating the operation of the avalanche photodiode according to the first embodiment.
Figure 5B:
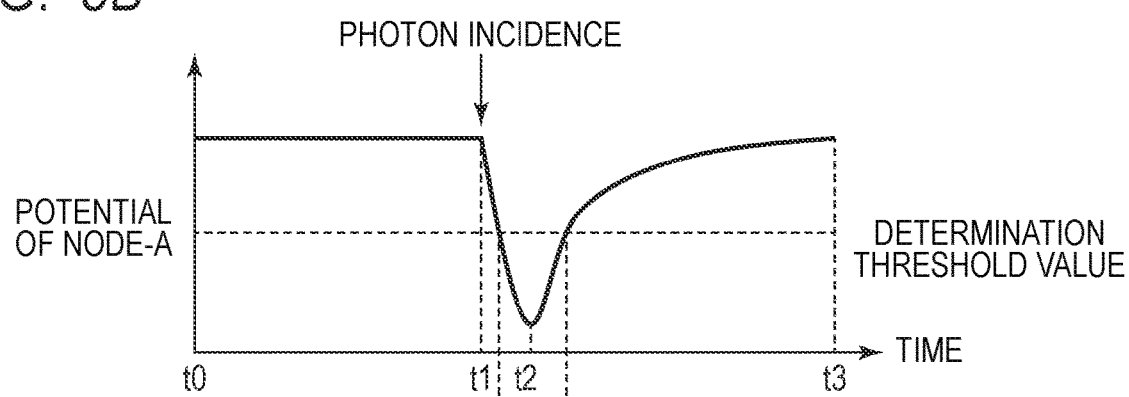
Figure 5C:
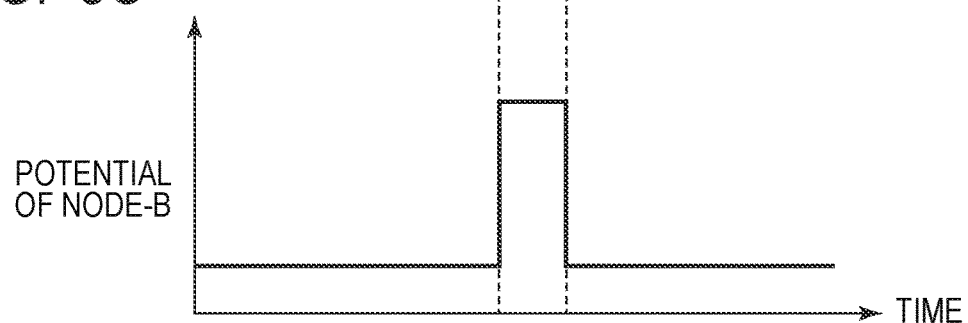

FIGS. 5A, 5B, and 5C are diagrams illustrating the operation of the APD 201 according to the present embodiment. FIG. 5A is a diagram illustrating the APD 201, the quench element 202, and the waveform shaping unit 210 in FIG. 4. As illustrated in FIG. 5A, the connection node of the input terminal of the APD 201, the quench element 202, and the waveform shaping unit 210 is referred to as a node A. Further, as illustrated in FIG. 5A, a node of an output terminal of the waveform shaping unit 210 is referred to as a node B.

FIG. 5B is a graph illustrating a change over time in the potential of the node A in FIG. 5A. FIG. 5C is a graph illustrating a change over time in the potential of the node B in FIG. 5A. During the period from time t0 to time t1, the voltage VH-VL is applied to the APD 201. When a photon enters the APD 201 at time t1, avalanche multiplication occurs in the APD 201. As a result, an avalanche current flows through the quench element 202, and the potential of the node A drops. Thereafter, the amount of voltage drop further increases, and the voltage applied to the APD 201 gradually decreases. Then, at time t2, the avalanche multiplication in the APD 201 is stopped. As a result, the potential of the node A does not drop below a certain constant value. Thereafter, during the period from time t2 to time t3, a current that compensates for the voltage drop flows from the node of the voltage VH to the node A, and at time t3, the node A is set to the original potential.

In the above process, the potential of the node B becomes the high level during a period in which the potential of the node A is lower than a certain threshold value. In this way, the waveform of the drop in the potential of the node A caused by the incidence of the photon is shaped by the waveform shaping unit 210, and is output to the node B as a pulse.

FIG. 6 is a timing chart illustrating the operation of the pixel signal processing unit 103 according to the present embodiment. FIG. 6 illustrates the relationship between the levels of the control signals pVSEL, pHSEL0, and pHSEL1 and the signal POUT in the pixel output signal line 113. In FIG. 6, only the k-th row and the (k+1)-th row are illustrated for the control signals pVESL and POUT, and only the 0-th column and the n-th column are illustrated for the control signals pHSEL0 and pHSEL1, but the same applies to other rows and columns. Note that the k-th row can be any row from the 0-th row to the (m−1)-th row.

At time t1, the control signal pVSEL[k] becomes the high level, and the pixel output circuit 212 in the k-th row is activated. Thus, the pixel signal processing unit 103 in the k-th row is selected.

From time t2 to time t3, control signal pHSEL0[0] becomes the high level while control signal pHSEL1[0] is at the low level. Thus, the first output circuit 212a in the k-th row and in the 0-th column reads the value P01 of the first bit held in the first memory 211a and outputs the read value P01 to the pixel output signal line 113 in the k-th row.

From time t4 to time t5, control signal pHSEL1[0] becomes the high level while control signal pHSEL0[0] is at the low level. Thus, the second output circuit 212b in the k-th row and the 0-th column reads the value P02 of the second bit held in the second memory 211b and outputs the read value to the pixel output signal line 113 in the k-th row.

Note that the period between the time t1 and the time t2 and the period between the time t3 and the time t4 may include a pixel output signal line reset period in which the reset operation of the potential of the pixel output signal line 113 is performed. This reset operation is an operation of resetting the potential of the pixel output signal line 113 by applying a predetermined potential to the pixel output signal line 113 from an external potential supply line before reading the value of each bit. Since the pixel output signal line 113 is reset to a predetermined potential before a signal is output from the pixel output circuit 212 to the pixel output signal line 113, the influence of external noise or the level of the signal output to the pixel output signal line 113 immediately before is reduced. Thus, the output of a signal from the pixel output circuit 212 to the pixel output signal line 113 can be stabilized.

The length of the pixel output signal line reset period in the period from time t1 to time t2 and the length of the pixel output signal line reset period in the period from time t3 to time t4 may be different from each other. For example, it is assumed that the first bit value P01 is required to be output in a more stable state than the second bit value P02. In this case, the pixel output signal line reset period included in the period from time t1 to time t2 is preferably set longer than the pixel output signal line reset period included in the period from time t3 to time t4. This can further stabilize the output of the first bit value P01 from the first output circuit 212a to the pixel output signal line 113.

As described above, the pixel signal processing unit 103 in the k-th row and the 0-th column outputs a signal to the pixel output signal line 113. At this time, since the value P01 of the first bit and the value P02 of the second bit are selectively read out, they are not read out to one pixel output signal line 113 at the same time. Further, by outputting the first bit value P01 and the second bit value P02 to one pixel output signal line 113 at different timings, the pixel output signal line 113 can be shared by a plurality of bits. By combining the first bit value P01 and the second bit value P02, a digital signal value corresponding to the pixel signal processing unit 103 in the k-th row and the 0-th column can be acquired. Same reading is sequentially performed on the first to (n−1)-th columns.

From time t6 to time t7, control signal pHSEL0[n] becomes the high level. Thus, the first output circuit 212a in the k-th row and in the n-th column reads the value Pn1 of the first bit held in the first memory 211a and outputs the read value Pn1 to the pixel output signal line 113 in the k-th row.

From time t8 to time t9, control signal pHSEL1[n] becomes the high level. Thus, the second output circuit 212b in the k-th row and in the n-th column reads the value Pn2 of the second bit held in the second memory 211b and outputs the value Pn2 to the pixel output signal line 113 in the k-th row.

The above-described pixel output signal line reset period may be included in a period before the time t6 and a period between the time t7 and the time t8. Further, the lengths of these pixel output signal line reset periods may be different from each other.

As described above, the pixel signal processing unit 103 in the k-th row and the n-th column outputs a signal to the pixel output signal line 113. At time t10, the control signal pVSEL[k] becomes the low level, and the pixel output circuit 212 in the k-th row is inactivated. Thereby, the selection of the pixel signal processing unit 103 in the k-th row is canceled. Reading from the pixel signal processing unit 103 in the k-th row is performed from the time t1 to the time t10.

Next, from time t11 to time t20, readout from the pixel signal processing unit 103 in the (k+1)-th row is performed. This operation is substantially the same as the operation of the k-th row from the time t1 to the time t10, and a description thereof will be omitted.

As described above, in the present embodiment, the first bit signal and the second bit signal of the digital signals held in the pixel signal processing unit 103 are commonly output to one pixel output signal line 113. The term "commonly output" here refers to the condition in which two outputs are tied together but at most only one output is enabled based on the control timing signals. Therefore the output line is shared by the two outputs and thus they commonly output to one pixel output signal line 113. Thus, the number of pixel output signal lines 113 can be reduced as compared with the case where individual pixel output signal lines are provided for each bit, and the area required for wiring the pixel output signal lines 113 can be reduced. Therefore, according to the present embodiment, a signal processing device capable of reducing the area of wirings is provided.

Further, by utilizing the area acquired by reducing the number of wirings of the pixel output signal line 113 for increasing the width of the wirings and the space between the wirings, the time constant of the pixel output signal line 113 can be reduced by adjusting the wiring resistance and the capacitance between the wirings. Therefore, the output delay may be reduced by appropriately designing the line and space of the pixel output signal line 113 while applying the configuration of the present embodiment.

Second Embodiment

In the photoelectric conversion device 100 of the present embodiment, the counter circuit 211 and the pixel output circuit 212 correspond to a 4-bit digital signal. The description of elements common to the first embodiment may be omitted or simplified.

Figure 7:
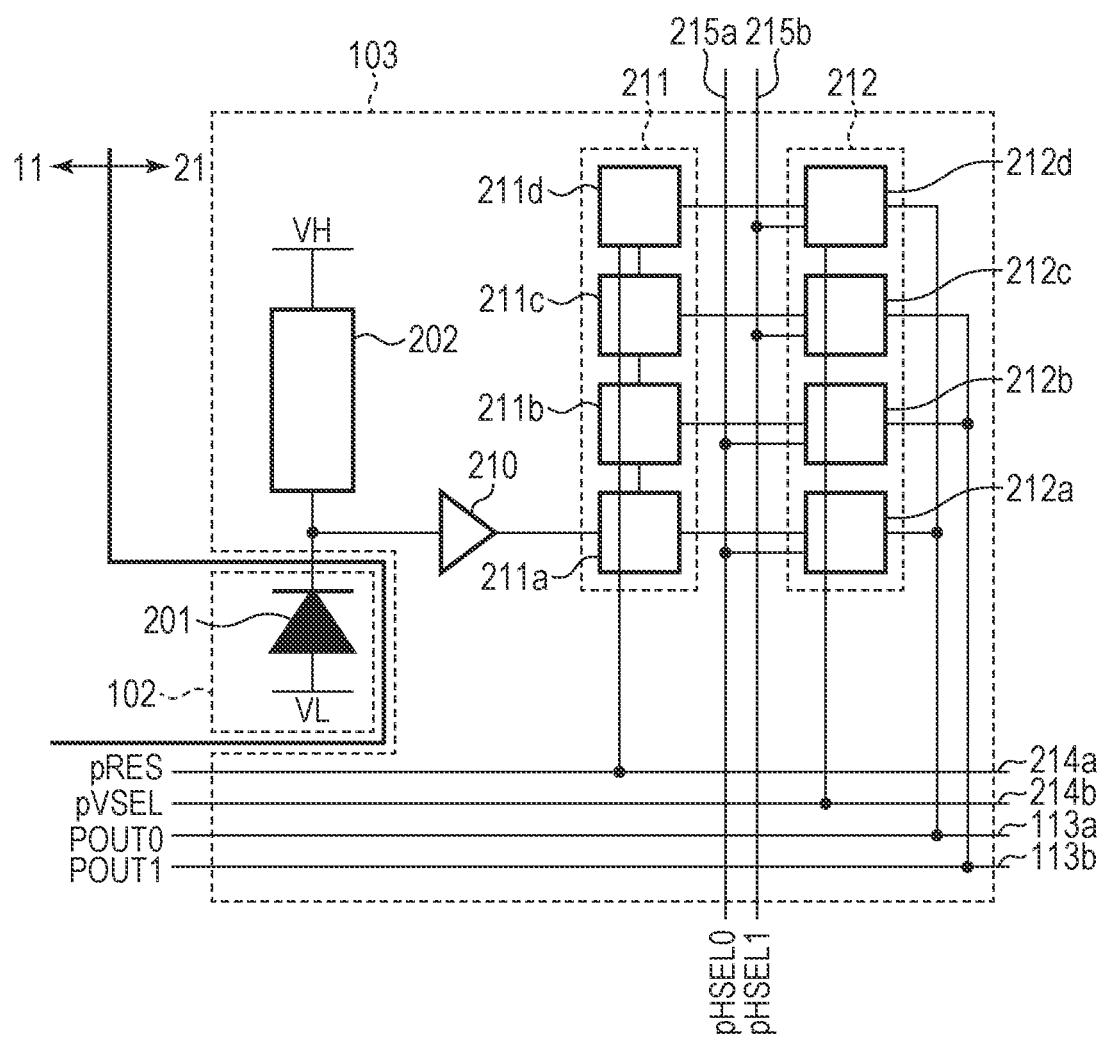
FIG. 7 is a schematic block diagram illustrating a configuration example of one pixel in the photoelectric conversion unit and the pixel signal processing unit according to a second embodiment.

FIG. 7 is a schematic block diagram illustrating a configuration example of one pixel of the photoelectric conversion unit 102 and the pixel signal processing unit 103 according to the present embodiment. The counter circuit 211 of the present embodiment further includes a third memory 211c and a fourth memory 211d in addition to the configuration illustrated in FIG. 4. The first to fourth bits held in the first to fourth memories 211a to 211d are 4-digit bits that are consecutive in this order. The pixel signal processing unit 103 of the present embodiment further includes a third output circuit 212c and a fourth output circuit 212d in addition to the configuration illustrated in FIG. 4. In the present embodiment, a pixel output signal line 113a (first signal line) connected to the first output circuit 212a and the fourth output circuit 212d and a pixel output signal line 113b (second signal line) connected to the second output circuit 212b and the third output circuit 212c are arranged.

The first output circuit 212a is configured to read the value of the first bit held in the first memory 211a based on the control signal pHSEL0 and output the read value to the pixel output signal line 113a. The fourth output circuit 212d is configured to read the value of the fourth bit held in the fourth memory 211d based on the control signal pHSEL1 and output the value to the pixel output signal line 113a. That is, the pixel output signal line 113a is a common signal line for transmitting signals of the first bit and the fourth bit.

The second output circuit 212b is configured to read the value of the second bit held in the second memory 211b based on the control signal pHSEL0 and output the read value to the pixel output signal line 113b. The third output circuit 212c is configured to read the value of the third bit held in the third memory 211c based on the control signal pHSEL1 and output the value to the pixel output signal line 113b. That is, the pixel output signal line 113b is a common signal line for transmitting signals of the second bit and the third bit.

Figure 8:
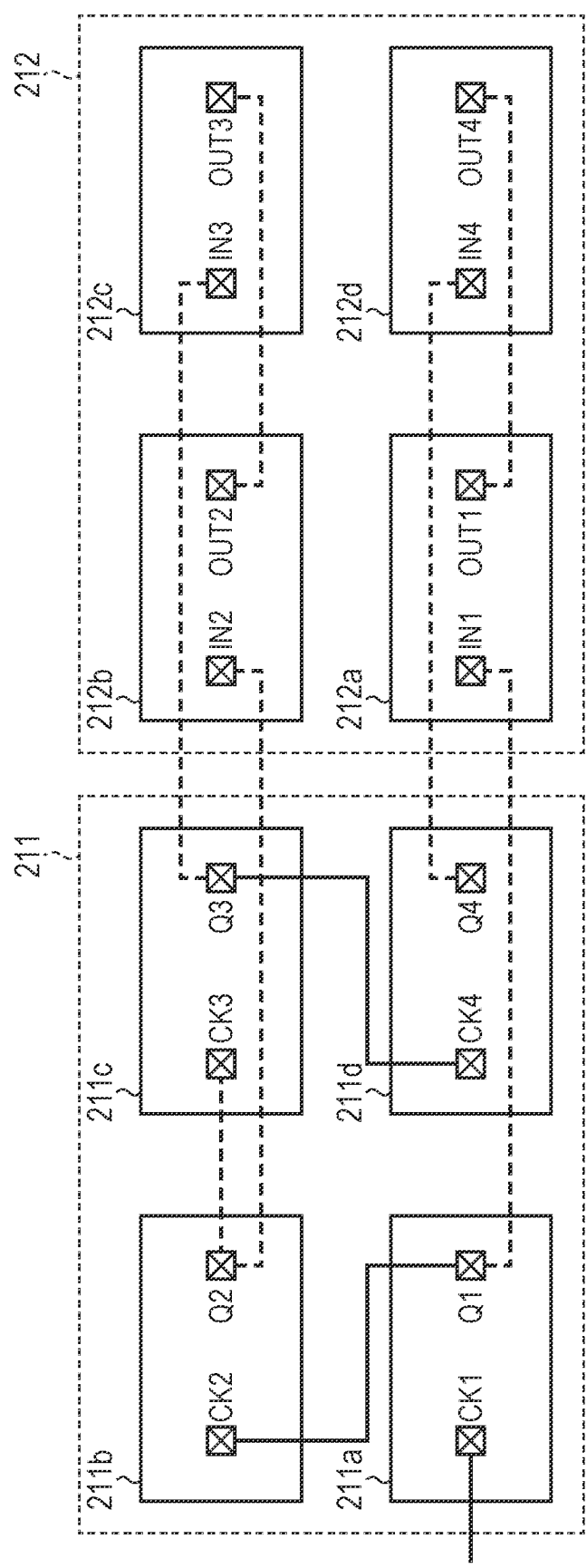
FIG. 8 is a schematic diagram illustrating a connection relationship between a counter circuit and a pixel output circuit according to the second embodiment.

FIG. 8 is a schematic diagram illustrating a connection relationship between the counter circuit 211 and the pixel output circuit 212 according to the present embodiment. FIG. 8 schematically illustrates the arrangement of the memories and the input circuits, and the connection relationship of the wirings of the first wiring layer and the second wiring layer interconnecting the memories and the input circuits. In the counter circuit 211, memories corresponding to the first to fourth bits have an input terminal CK and an output terminal Q. In the pixel output circuit 212, each of the output circuits corresponding to the first to fourth bits has an input terminal IN and an output terminal OUT. In FIG. 8, reference numerals of the input terminal CK, the output terminal Q, the input terminal IN, and the output terminal OUT are given numbers indicating corresponding bits, for example, "CK1".

As illustrated in FIG. 8, the first memory 211a and the second memory 211b are arranged adjacent to each other in the second direction (vertical direction), and the second memory 211b and the third memory 211c are arranged adjacent to each other in the first direction (horizontal direction). The third memory 211c and the fourth memory 211d are arranged adjacent to each other in the second direction, and the fourth memory 211d and the first memory 211a are arranged adjacent to each other in the first direction. Thus, by arranging a plurality of memories in a unicursal and folded pattern in accordance with the order of bits, it is possible to minimize the length of the wiring for an arithmetic carry between bits, and the wiring efficiency is improved.

As illustrated in FIG. 8, the first output circuit 212a and the second output circuit 212b are arranged adjacent to each other in the second direction, and the second output circuit 212b and the third output circuit 212c are arranged adjacent to each other in the first direction. The third output circuit 212c and the fourth output circuit 212d are arranged adjacent to each other in the second direction, and the fourth output circuit 212d and the first output circuit 212a are arranged adjacent to each other in the first direction. Thus, the arrangement order of the memories and the output circuits is in a parallel movement relationship. That is, the positional relationship in a plan view of each memory is the same as the positional relationship in the plan view of each output circuit. Such an arrangement realizes a layout in which wirings do not intersect between an output of the memory and an input of the output circuit, thereby improving wiring efficiency.

The output terminal of the waveform shaping unit 210 is connected to the input terminal CK1 of the first memory 211a by the wiring of the first wiring layer. The output terminal Q1 of the first memory 211a is connected to the input terminal CK2 of the second memory 211b by the wiring of the first wiring layer, and is connected to the input terminal IN1 of the first output circuit 212a by the wiring of the second wiring layer. The output terminal Q2 of the second memory 211b is connected to the input terminal CK3 of the third memory 211c by the wiring of the second wiring layer, and is connected to the input terminal IN2 of the second output circuit 212b by the wiring of the second wiring layer. The output terminal Q3 of the third memory 211c is connected to the input terminal CK4 of the fourth memory 211d by the wiring of the first wiring layer, and is connected to the input terminal IN3 of the third output circuit 212c by the wiring of the second wiring layer. The output terminal Q4 of the fourth memory 211d is connected to the input terminal IN4 of the fourth output circuit 212d by the wiring of the second wiring layer.

The output terminal OUT1 of the first output circuit 212a and the output terminal OUT4 of the fourth output circuit 212d are connected to each other by the wiring of the second wiring layer. The output terminal OUT2 of the second output circuit 212b and the output terminal OUT3 of the third output circuit 212c are connected to each other by the wiring of the second wiring layer.

Figure 9:
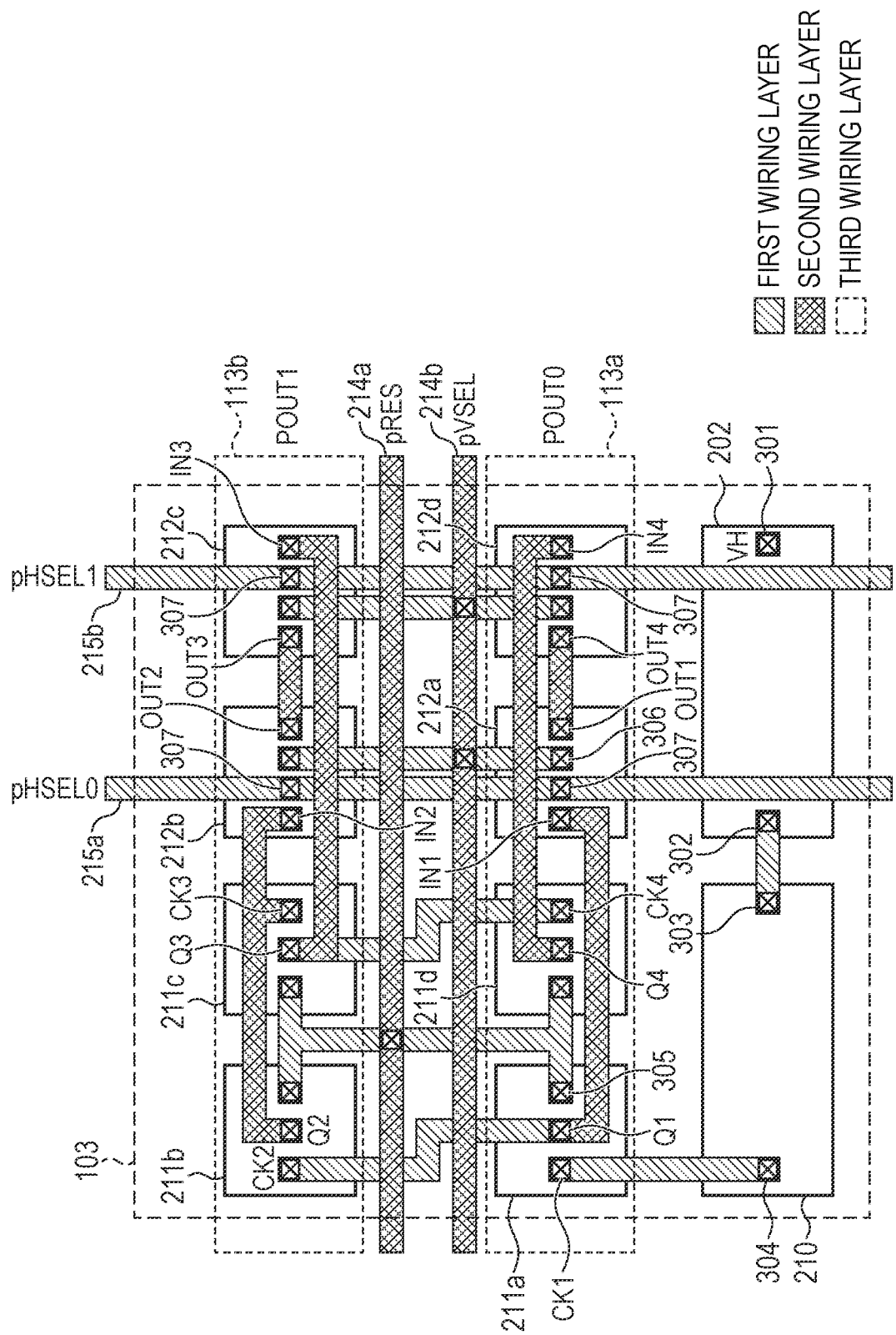
FIG. 9 is a plan view schematically illustrating a layout of the pixel signal processing unit according to the second embodiment.

FIG. 9 is a plan view schematically illustrating a layout of the pixel signal processing unit 103 according to the present embodiment. FIG. 9 schematically illustrates the arrangement of each memory and each input circuit, the connection relationship of the wirings of the first wiring layer and the second wiring layer connecting them to each other, the positions of the plugs, and the like. The description of the portions having the same connection relationship as in FIG. 8 will be omitted or simplified.

FIG. 9 schematically illustrates a quench element 202 and a waveform shaping unit 210 in addition to the counter circuit 211 and the pixel output circuit 212 illustrated in FIG. 8. The voltage VH is supplied to the second terminal 301 of the quench element 202. The first terminal 302 of the quench element 202 is connected to the input terminal 303 of the waveform shaping unit 210 by the wiring of the first wiring layer. The output terminal 304 of the waveform shaping unit 210 is connected to the input terminal CK1 of the first memory 211a by the wiring of the first wiring layer.

The reset terminal 305 of the first memory 211a is connected to the driving line 214a provided in the second wiring layer via the first wiring layer. The other memories are similarly connected to the driving line 214a.

The vertical selection terminal 306 of the first output circuit 212a is connected to the driving line 214b provided in the second wiring layer via the first wiring layer. The other output circuits are similarly connected to the driving line 214b.

The horizontal selection terminals 307 of the first output circuit 212a and the second output circuit 212b are connected to the driving line 215a provided in the first wiring layer. The horizontal selection terminals 307 of the third output circuit 212c and the fourth output circuit 212d are connected to the driving line 215b provided in the first wiring layer.

The output terminal OUT1 of the first output circuit 212a and the output terminal OUT4 of the fourth output circuit 212d are commonly connected to the pixel output signal line 113a provided in the third wiring layer. The output terminal OUT2 of the second output circuit 212b and the output terminal OUT3 of the third output circuit 212c are commonly connected to the pixel output signal line 113b provided in the third wiring layer.

Figure 10:
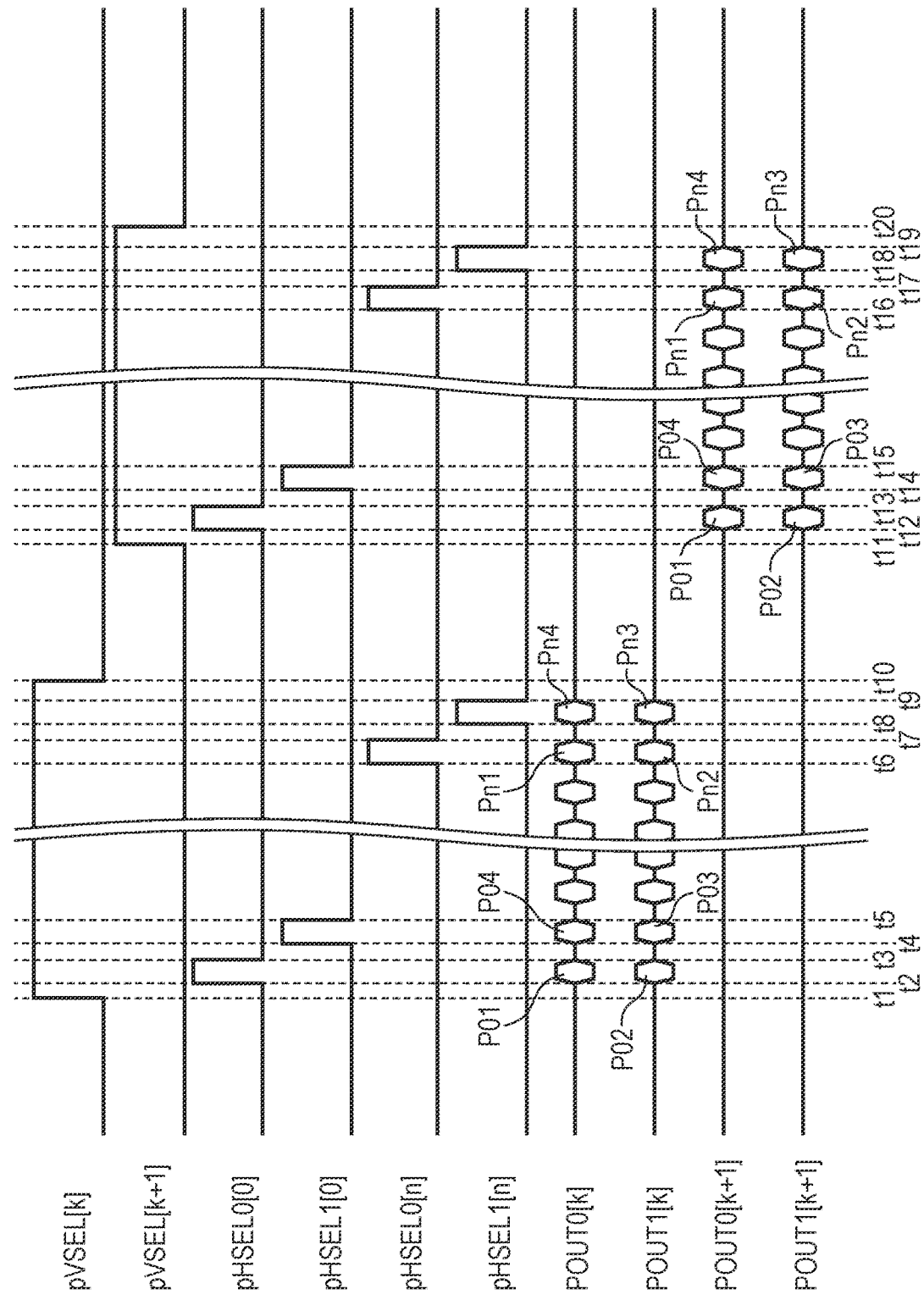
FIG. 10 is a timing chart illustrating the operation of the pixel signal processing unit according to the second embodiment.

FIG. 10 is a timing chart illustrating the operation of the pixel signal processing unit 103 according to the present embodiment. FIG. 10 illustrates the relationship among the levels of the control signals pVSEL, pHSEL0, and pHSEL1, the signal POUT0 in the pixel output signal line 113a, and the signal POUT1 in the pixel output signal line 113b.

At time t1, the control signal pVSEL[k] becomes the high level, and the pixel output circuit 212 in the k-th row is activated. Thus, the pixel signal processing unit 103 in the k-th row is selected.

From time t2 to time t3, control signal pHSEL0[0] becomes the high level. Thus, the first output circuit 212a in the k-th row and in the 0-th column reads the value P01 of the first bit held in the first memory 211a and outputs the read value P01 to the pixel output signal line 113a in the k-th row. The second output circuit 212b in the k-th row and in the 0-th column reads the value P02 of the second bit held in the second memory 211b and outputs the value P02 to the pixel output signal line 113b in the k-th row.

From time t4 to time t5, control signal pHSEL1[0] becomes the high level. Thus, the third output circuit 212c in the k-th row and in the 0-th column reads the value P03 of the third bit held in the third memory 211c and outputs the value P03 to the pixel output signal line 113b in the k-th row. The fourth output circuit 212d in the k-th row and the 0-th column reads the value P04 of the fourth bit held in the fourth memory 211d and outputs the value P04 to the pixel output signal line 113a in the k-th row.

As described above, the pixel signal processing unit 103 in the k-th row and the 0-th column outputs signals to the pixel output signal lines 113a and 113b. By outputting the first bit value P01 and the fourth bit value P04 to one pixel output signal line 113a at different timings, the pixel output signal line 113a can be shared by a plurality of bits. Further, by outputting the second bit value P02 and the third bit value P03 to one pixel output signal line 113b at different timings, the pixel output signal line 113b can be shared by a plurality of bits. Note that the processes in the subsequent periods are substantially the same as those described so far, and thus description thereof will be omitted.

As described above, in the present embodiment, the first bit signal and the fourth bit signal in the digital signal held in the pixel signal processing unit 103 are commonly output to one pixel output signal line 113a. The second bit signal and the third bit signal are commonly output to one pixel output signal line 113b. Thus, the number of the pixel output signal lines 113a and 113b can be reduced compared to the case where individual pixel output signal line is provided for each bit, and the area required for wiring the pixel output signal lines 113 can be reduced. Further, in the present embodiment, since the plurality of memories and the plurality of output circuits can be arranged in a unicursal and folded pattern, wiring efficiency is improved. Therefore, according to the present embodiment, a signal processing device capable of reducing the area of wirings is provided.

Third Embodiment

In the photoelectric conversion device 100 of the present embodiment, the counter circuit 211 corresponds to a 3-bit digital signal, and the pixel output circuit 212 has a dummy circuit. The description of elements common to the first embodiment or the second embodiment may be omitted or simplified.

Figure 11:
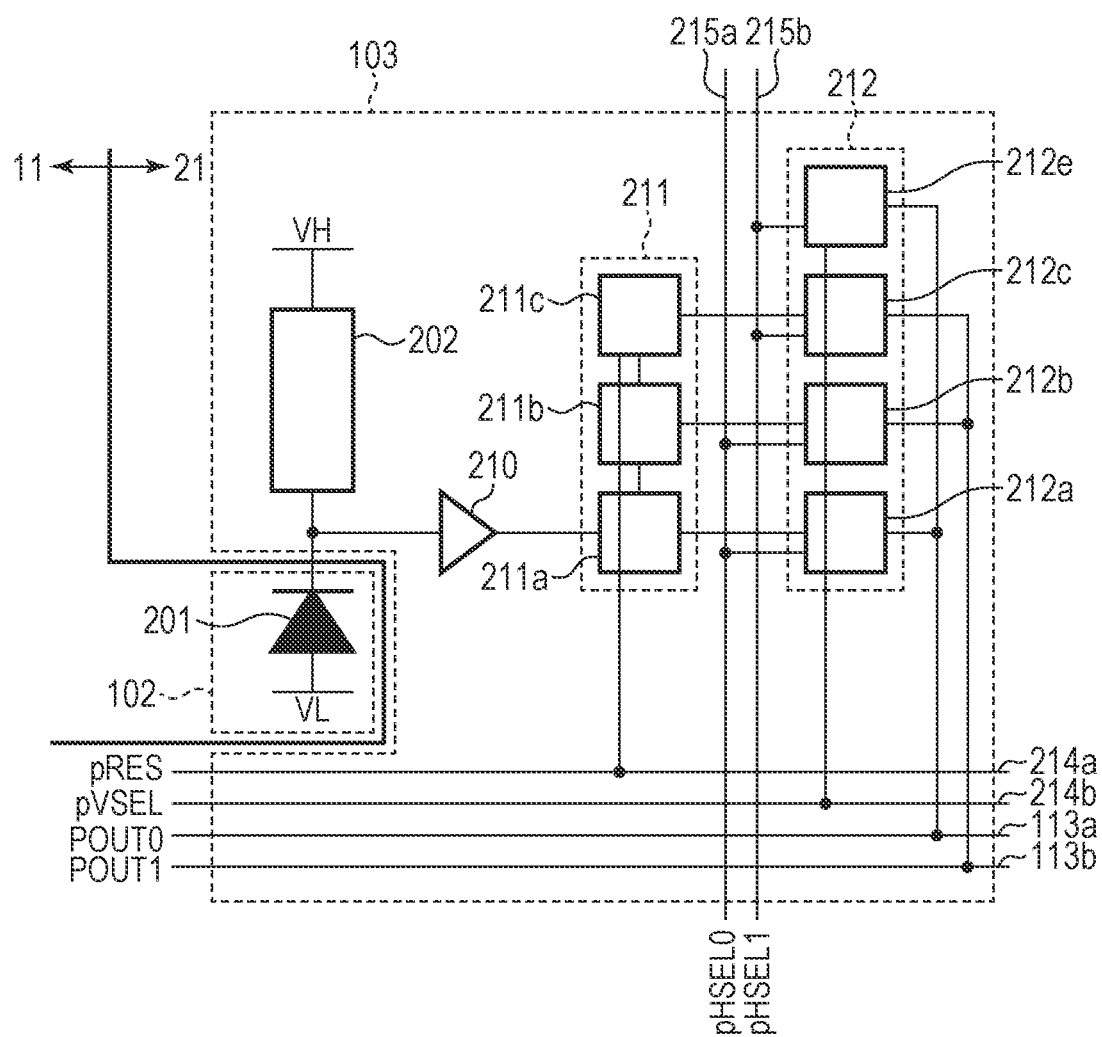
FIG. 11 is a schematic block diagram illustrating a configuration example of one pixel in a photoelectric conversion unit and a pixel signal processing unit according to a third embodiment.

FIG. 11 is a schematic block diagram illustrating a configuration example of one pixel of the photoelectric conversion unit 102 and the pixel signal processing unit 103 according to the present embodiment. The counter circuit 211 of the present embodiment further includes a third memory 211c in addition to the configuration illustrated in FIG. 4. The pixel signal processing unit 103 of the present embodiment further includes a third output circuit 212c and a dummy circuit 212e in addition to the configuration illustrated in FIG. 4. The dummy circuit 212e outputs a dummy signal having a fixed value. In the present embodiment, the pixel output signal line 113a connected to the first output circuit 212a and the dummy circuit 212e and the pixel output signal line 113b connected to the second output circuit 212b and the third output circuit 212c are arranged.

The first output circuit 212a is configured to read the value of the first bit held in the first memory 211a based on the control signal pHSEL0 and output the read value to the pixel output signal line 113a. The dummy circuit 212e is configured to output a dummy signal to the pixel output signal line 113a based on the control signal pHSEL1. That is, the pixel output signal line 113a is a common signal line for transmitting the first bit and the dummy signal.

Figure 12:
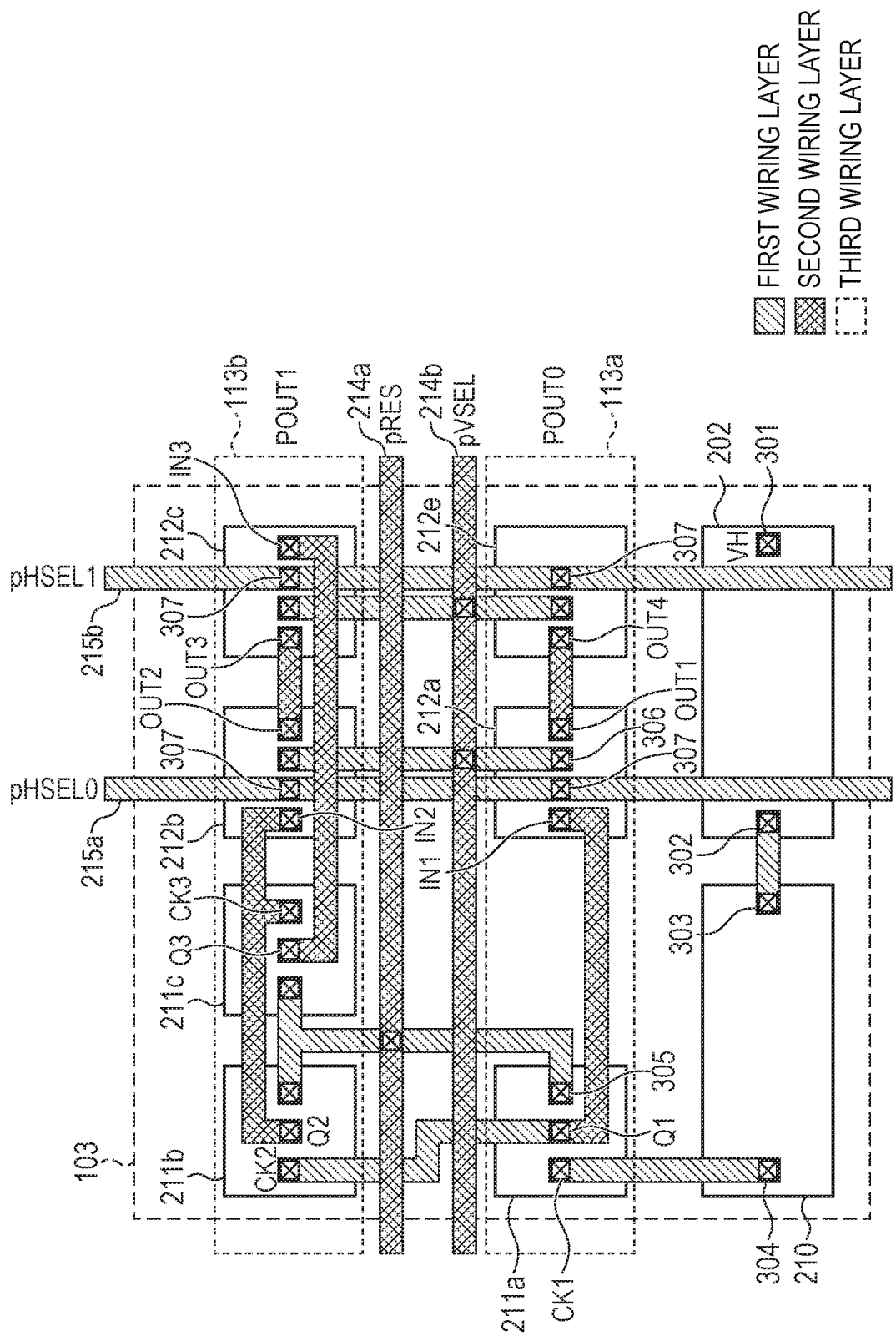
FIG. 12 is a plan view schematically illustrating a layout of the pixel signal processing unit according to the third embodiment.

FIG. 12 is a plan view schematically illustrating a layout of the pixel signal processing unit 103 according to the present embodiment. Description of the same portions as those in FIG. 9 will be omitted or simplified.

FIG. 12 differs from FIG. 9 in that a fourth memory 211d and wirings connected thereto are not provided, and that a dummy circuit 212e is provided instead of the fourth output circuit 212d. The dummy circuit 212e does not have an input terminal corresponding to the input terminal IN4 of the fourth output circuit 212d, and the dummy circuit 212e outputs a dummy signal having a fixed value from the output terminal OUT4. The output terminal OUT1 of the first output circuit 212a and the output terminal OUT4 of the dummy circuit 212e are commonly connected to the pixel output signal line 113a provided in the third wiring layer.

Figure 13:
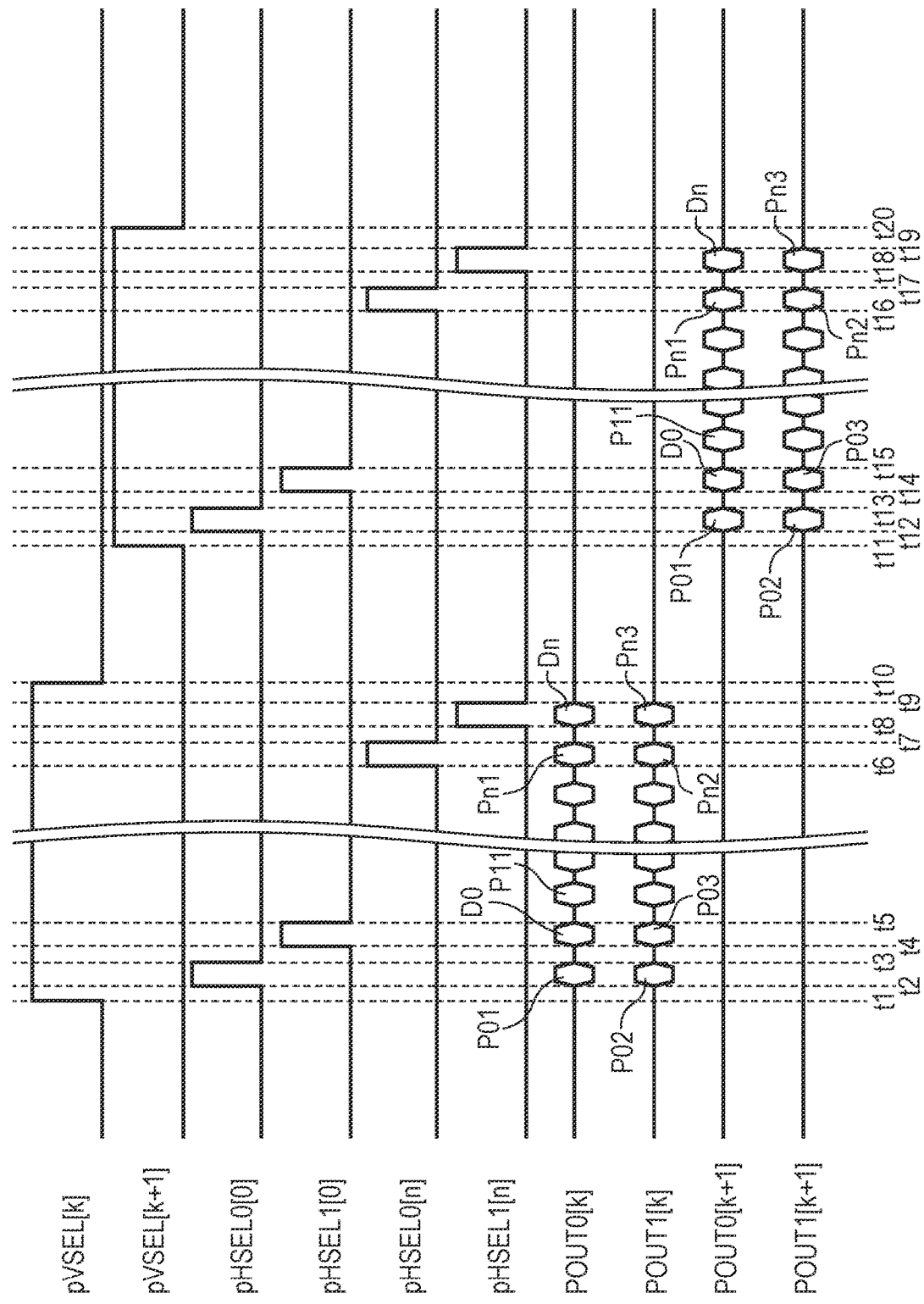
FIG. 13 is a timing chart illustrating the operation of the pixel signal processing unit according to the third embodiment.

FIG. 13 is a timing chart illustrating the operation of the pixel signal processing unit 103 according to the present embodiment. Description of the same operations as those in FIG. 10 will be omitted or simplified.

FIG. 13 is different from FIG. 10 in that a dummy signal is output during a period from time t4 to time t5. From time t4 to time t5, control signal pHSEL1[0] becomes the high level. Thus, the third output circuit 212c in the k-th row and in the 0-th column reads the value P03 of the third bit held in the third memory 211c and outputs the value P03 to the pixel output signal line 113b in the k-th row. The dummy circuit 212e in the k-th row and the 0-th column outputs the dummy signal D0 to the pixel output signal line 113a in the k-th row. By outputting the first bit value P01 and the dummy signal D0 to one pixel output signal line 113a at different timings, the pixel output signal line 113a can be shared by the first bit value P01 and the dummy signal D0. Since the processes in the other periods are substantially the same as those described above, description thereof will be omitted.

The fixed value of the dummy signal output by the dummy circuit 212e may be the low level or the high level. However, the fixed value may be the same level as the level given to the memory that holds the value of the bit output next to the dummy signal when the memory is reset by the control signal pRES. For example, when attention is paid to the k-th row in the present embodiment, the value of the bit output next to the dummy signal D0 is P11, and this is the value of the bit stored in the first memory 211a inside the pixel signal processing unit 103 in the k-th row and the first column. For example, when the value of the bit held in the first memory 211a when the control signal pRES is input to the first memory 211a and reset is low, the value of the dummy signal D0 is low.

The effect of setting the fixed value output by the dummy circuit 212e in this manner will be described. When signals are sequentially output via the same pixel output signal line 113a, a signal of an incorrect level may be output to the pixel output signal line 113a depending on the influence of the level of the signal output immediately before. For example, it is assumed that the dummy signal D0 output to the pixel output signal line 113a is at the high level, and the bit value held in the first memory 211a in the pixel signal processing unit 103 in the k-th row and the first column is at the low level. In this case, the bit value P11 output next to the dummy signal D0 in FIG. 13 should originally be the low level. However, there is a possibility that the bit value P11 becomes high due to the influence of the high level dummy signal D0 output one bit before. Such an error in the bit value greatly affects the image quality under a condition where the S/N ratio is small, especially under a condition where there is no incident light. The condition in which there is no incident light may be referred to as a condition in which a pulse is not output from the APD 201. Therefore, if the level of the dummy signal D0 is set such that the dummy signal D0 and the bit value P11 output next are at the same level under the condition in which there is no incident light, an error in the bit value under the condition in which there is no incident light is less likely to occur. For example, under a condition in which there is no incident light, the bit value P11 is equal to the level given when the first memory 211a in the pixel signal processing unit 103 in the k-th row and the first column is reset by the control signal pRES. In order to obtain the above-described effect, it is desirable that the fixed value of the dummy signal D0 be at the same level as P11 of the bit value output next.

As described above, in the present embodiment, the first bit signal and the dummy signal of the digital signals held in the pixel signal processing unit 103 are commonly output to one pixel output signal line 113a. The reason why the dummy circuit 212e for outputting the dummy signal is provided will be described. When the number of bits of the digital signal is an odd number such as three, the number of signals flowing in one of the plurality of pixel output signal lines is smaller than that in the other pixel output signal lines, so that a blank period in which no signal flows may occur. In the blank period, since the potential becomes inconstant, it is necessary to process the digital value including the inconstant bit in the subsequent signal processing stage, which may complicate the signal processing. In contrast, in the present embodiment, a dummy signal having a fixed value is output during the blank period, and the bit value of the blank period becomes constant, so that signal processing is facilitated. Thus, according to the present embodiment, in addition to the effect of the first embodiment or the second embodiment, a photoelectric conversion device 100 which has an effect of facilitating signal processing when the bit value of the digital signal is odd is provided.

Fourth Embodiment

In the photoelectric conversion device 100 of the present embodiment, similarly to the second embodiment, the counter circuit 211 and the pixel output circuit 212 correspond to a 4-bit digital signal, and an open drain buffer circuit is used for the pixel output circuit 212. The description of elements common to any of the first to third embodiments may be omitted or simplified.

Figure 14:
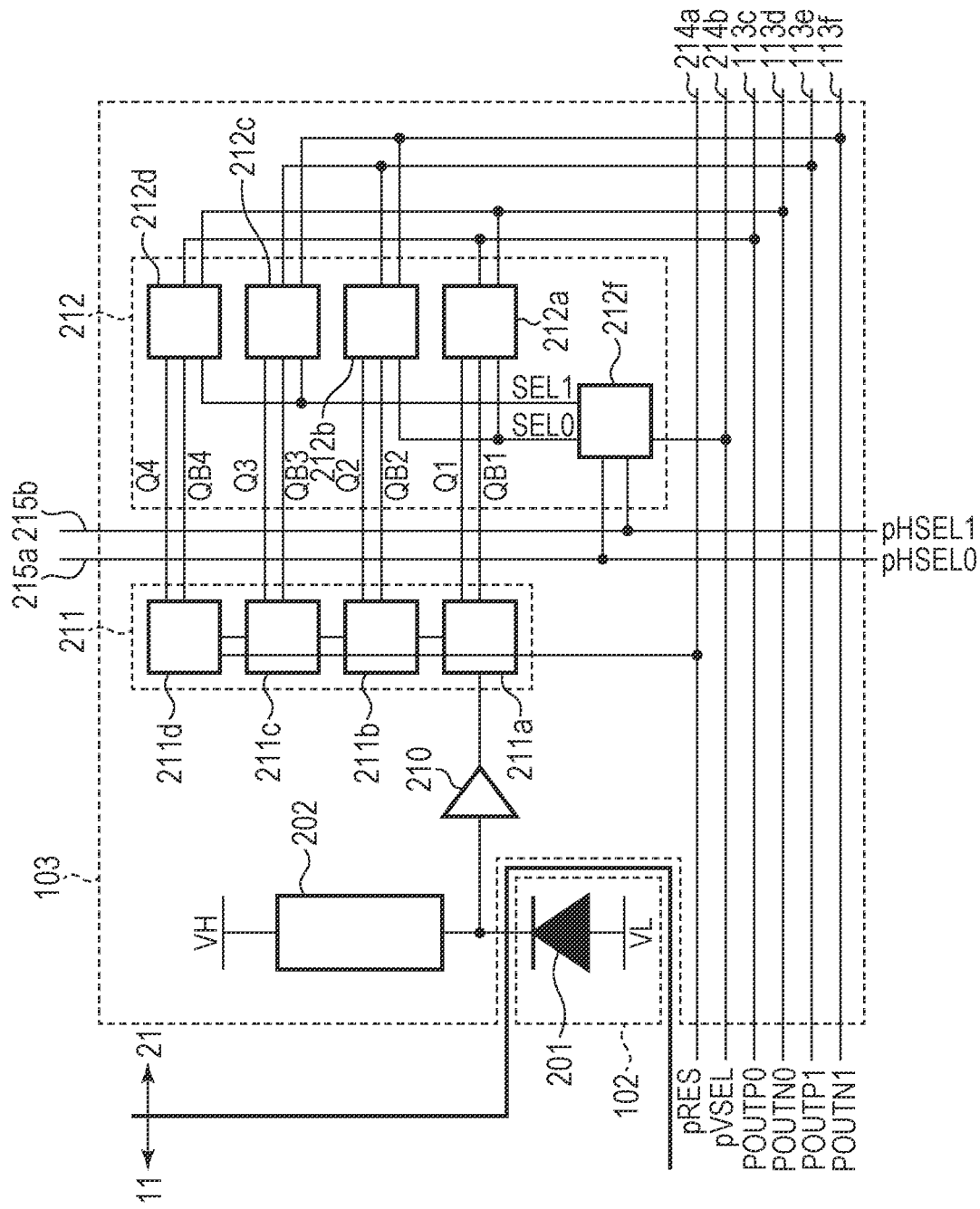
FIG. 14 is a schematic block diagram illustrating a configuration example of one pixel in a photoelectric conversion unit and a pixel signal processing unit according to a fourth embodiment.

FIG. 14 is a schematic block diagram illustrating a configuration example of one pixel of the photoelectric conversion unit 102 and the pixel signal processing unit 103 according to the present embodiment. The first memory 211a of the present embodiment outputs the first output signal Q1 and the second output signal QB1, which is an inverted signal of the first output signal Q1, to the first output circuit 212a. Similarly, the second memory 211b, the third memory 211c, and the fourth memory 211d are configured to output the first output signals Q2, Q3, and Q4 and the second output signals QB2, QB3, and QB4, which are their inverted signals.

The pixel signal processing unit 103 of the present embodiment further includes a selection circuit 212f. The control signal pHSEL0 is input to the selection circuit 212f from the driving line 215a, the control signal pHSEL1 is input to the selection circuit 212f from the driving line 215b, and the control signal pVSEL is input to the selection circuit 212f from the driving line 214b. The selection circuit 212f generates control signals SEL0 and SEL1 based on the control signals pHSEL0, pHSEL1, and pVSEL. The control signal SEL0 is input to the first output circuit 212a and the second output circuit 212b, and controls the activation or inactivation of these circuits. The control signal SEL1 is input to the third output circuit 212c and the fourth output circuit 212d, and controls the activation or inactivation of these circuits.

In the present embodiment, pixel output signal lines 113c, 113d, 113e and 113f are arranged. The first output circuit 212a and the fourth output circuit 212d output the first output signals Q1 and Q4 to the pixel output signal line 113c, and output the second output signals QB1 and QB4 to the pixel output signal line 113d. The second output circuit 212b and the third output circuit 212c output the first output signals Q2 and Q3 to the pixel output signal line 113e, and output the second output signals QB2 and QB3 to the pixel output signal line 113f. The signals output to the pixel output signal lines 113c, 113d, 113e and 113f are referred to as signals POUTP0, POUTN0, POUTP1, and POUTN1, respectively.

Figure 15:
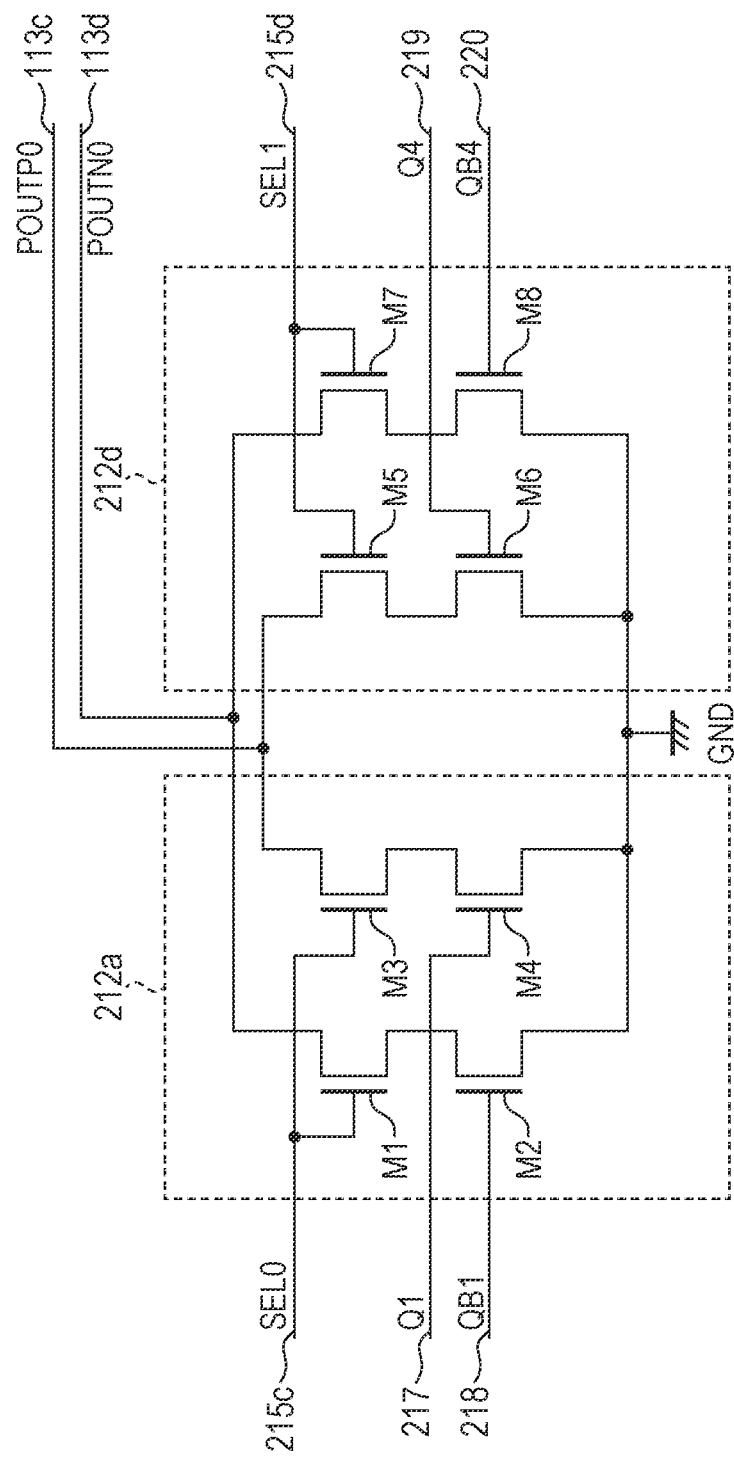
FIG. 15 is a circuit diagram illustrating a configuration example of an open drain buffer circuit according to the fourth embodiment.

The first output circuit 212a, the second output circuit 212b, the third output circuit 212c, and the fourth output circuit 212d of the present embodiment are configured by an open drain buffer circuit. FIG. 15 is a circuit diagram illustrating a configuration example of an open drain buffer circuit according to the present embodiment. FIG. 15 illustrates an example of an open drain buffer circuit constituting the first output circuit 212a and the fourth output circuit 212d.

The open drain buffer circuit illustrated in FIG. 15 includes transistors M1, M2, M3, and M4 constituting the first output circuit 212a, and transistors M5, M6, M7, and M8 constituting the fourth output circuit 212d. These transistors are n-type Metal Oxide Semiconductor (MOS) transistors.

The drain of the transistor M1 and the drain of the transistor M7 are connected in common to each other and are connected to the pixel output signal line 113d. The drain of the transistor M3 and the drain of the transistor M5 are connected in common to each other and are connected to the pixel output signal line 113c. The source of the transistor M1 is connected to the drain of the transistor M2. The source of the transistor M3 is connected to the drain of the transistor M4. The source of the transistor M5 is connected to the drain of the transistor M6. The source of the transistor M7 is connected to the drain of the transistor M8. The sources of the transistors M2, M4, M6, and M8 are connected in common to each other and connected to the ground wiring.

The control signal SEL0 is input to the gates of the transistors M1 and M3 via the signal line 215c. The control signal SEL1 is input to the gates of the transistors M5 and M7 via the signal line 215d. The first output signal Q1 is input to the gate of the transistor M4 via the signal line 217. The second output signal QB1 is input to the gate of the transistor M2 via the signal line 218. The first output signal Q4 is input to the gate of the transistor M6 via the signal line 219. The second output signal QB4 is input to the gate of the transistor M8 via the signal line 220.

Figure 16:
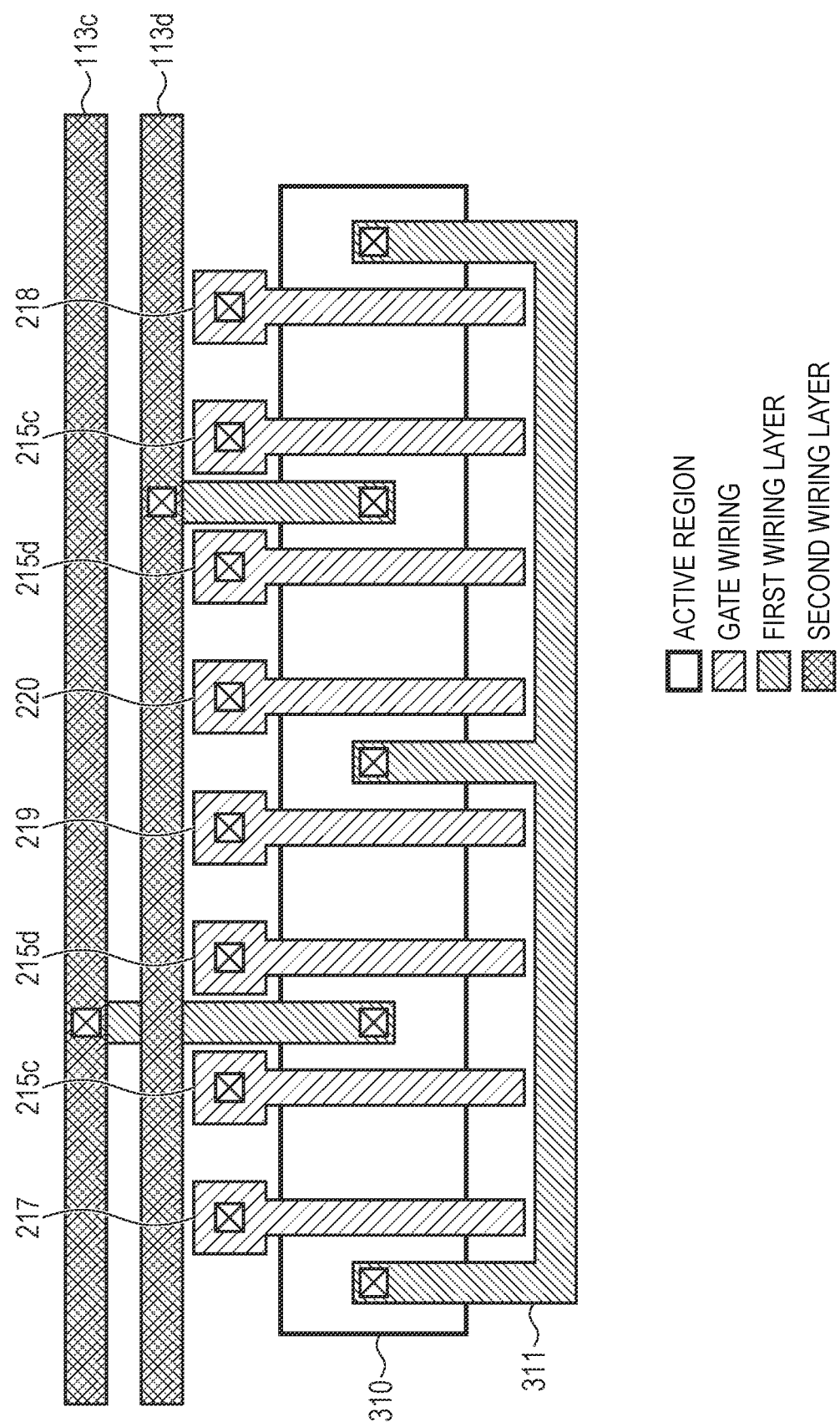
FIG. 16 is a plan view schematically illustrating a layout of an open drain buffer circuit according to the fourth embodiment.

FIG. 16 is a plan view schematically illustrating a layout of an open drain buffer circuit according to the present embodiment. FIG. 16 illustrates an arrangement of active regions 310 in which transistors M1 to M8 are formed, an arrangement of signal lines 215c, 215d and 217-220 as gate lines, an arrangement of pixel output signal lines 113c and 113d, and an arrangement of ground wiring 311. The ground wiring 311 is arranged in the first wiring layer, and the pixel output signal lines 113c and 113d are arranged in the second wiring layer.

As illustrated in FIG. 16, the active region 310 is shared by the transistors M1 to M8. The ground wiring 311 is shared by the transistors M2, M4, M6, and M8. Although only the first output circuit 212a and the fourth output circuit 212d are illustrated in FIGS. 15 and 16, the same circuit configuration and layout may be applied to the second output circuit 212b and the third output circuit 212c.

In the present embodiment, by using the open drain buffer circuit, a signal with a small voltage difference can be amplified and read out at high speed. The configuration of the present embodiment is particularly effective when the number of pixels is large and high-speed reading is required. Further, in the present embodiment, the common active region 310 and the common ground wiring 311 are provided, and the area efficiency of the layout is improved.

In the present embodiment, a signal processing device capable of reducing the area of wiring as in the first embodiment or the second embodiment is provided. In addition, according to the present embodiment, at least one effect of increasing the reading speed and improving the area efficiency of the layout can be realized.

Fifth Embodiment

The photoelectric conversion device 100 of the present embodiment includes pixel output signal lines 113 shared by signal processing units in two adjacent rows. The description of elements common to the first embodiment may be omitted or simplified.

Figure 17:
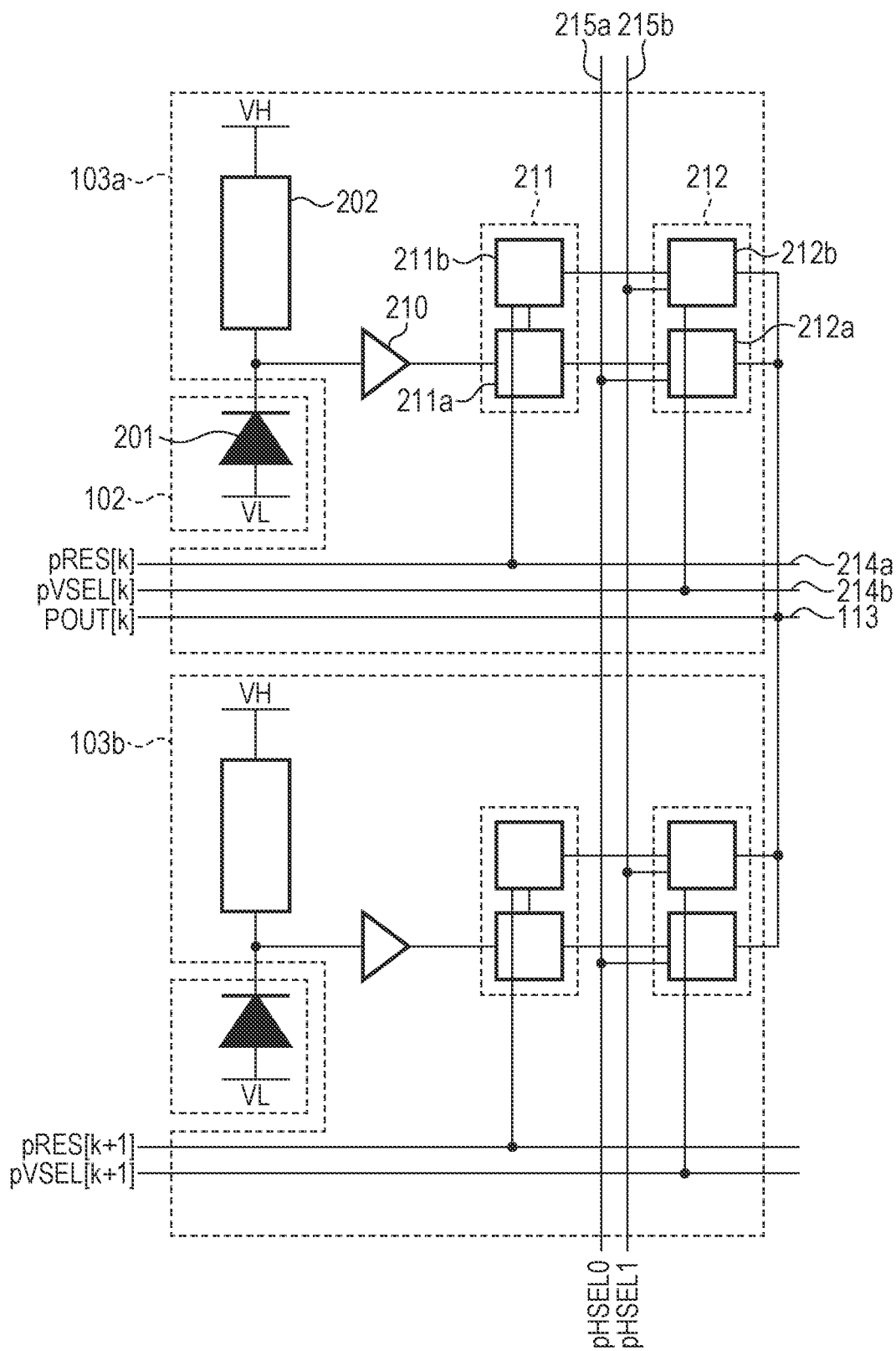
FIG. 17 is a schematic block diagram illustrating a configuration example of two pixels in a photoelectric conversion unit and a pixel signal processing unit according to a fifth embodiment.

FIG. 17 is a schematic block diagram illustrating a configuration example of two pixels of the photoelectric conversion unit 102 and the pixel signal processing units 103a and 103b according to the present embodiment. FIG. 17 illustrates a pixel signal processing unit 103a arranged in the k-th row and a pixel signal processing unit 103b arranged in the (k+1)-th row. As illustrated in FIG. 17, each of the pixel signal processing unit 103a and the pixel signal processing unit 103b is configured to output a signal to the pixel output signal line 113 in the k-th row. Thus, the number of the pixel output signal lines 113 can be reduced. Therefore, according to the present embodiment, the signal processing device capable of further reducing the area of the wiring as compared with the configuration of the first embodiment is provided.

Sixth Embodiment

The photoelectric conversion device 100 of the present embodiment includes a pixel output circuit 212 and a pixel output signal line 113 shared by pixel signal processing units in two adjacent rows. The description of elements common to the first embodiment or the fifth embodiment may be omitted or simplified.

Figure 18:
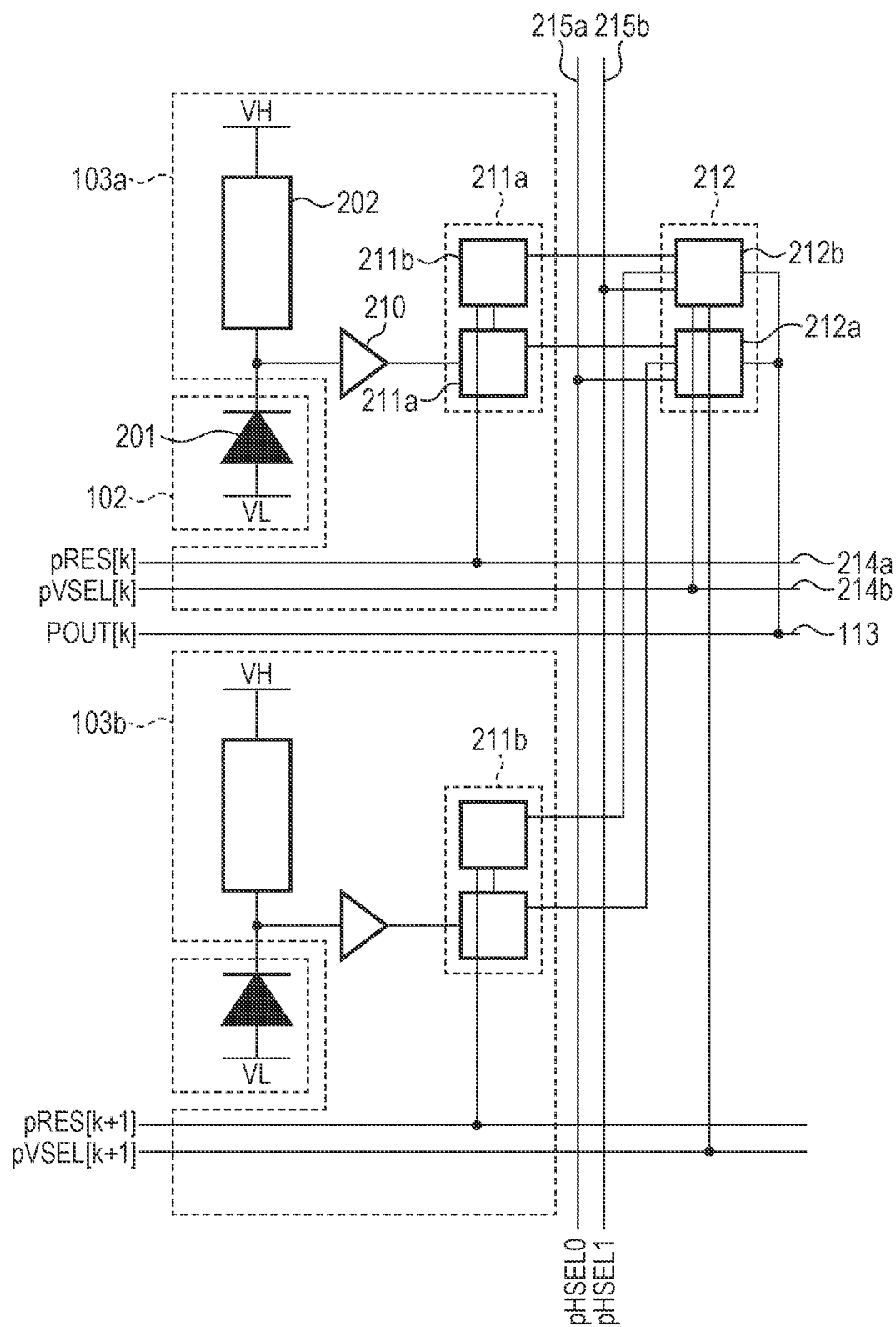
FIG. 18 is a schematic block diagram illustrating a configuration example of two pixels in a photoelectric conversion unit and a pixel signal processing unit according to a sixth embodiment.

FIG. 18 is a schematic block diagram illustrating a configuration example of two pixels of the photoelectric conversion unit 102 and the pixel signal processing units 103a and 103b according to the present embodiment. FIG. 18 illustrates a pixel signal processing unit 103a arranged in the k-th row and a pixel signal processing unit 103b arranged in the (k+1)-th row. In the present embodiment, the pixel output circuit 212 is arranged outside the pixel signal processing units 103a and 103b, and is shared by the pixel signal processing units 103a and 103b. The pixel output circuit 212 is connected to the pixel output signal line 113 in the k-th row. Therefore, as illustrated in FIG. 18, both the pixel signal processing unit 103a and the pixel signal processing unit 103b are configured to output signals to the pixel output signal line 113 in the k-th row. Thus, the number of the pixel output signal lines 113 can be reduced. In addition, the area required for the pixel output circuit 212 can be reduced. Therefore, according to the present embodiment, the signal processing device capable of further reducing the area of the wiring or the element compared to the configuration of the first embodiment is provided.

In the present embodiment, the pixel output circuit 212 is shared by the two pixel signal processing units 103a and 103b arranged in two rows, but the pixel output circuit 212 may be shared by the two pixel signal processing units arranged in two columns. In this case, too, the area required for the pixel output circuit 212 can be reduced.

Seventh Embodiment

In the photoelectric conversion device 100 of the present embodiment, the counter circuit 211 corresponds to a 3-bit digital signal, and the pixel output circuit 212 has a dummy circuit. The description of elements common to the first to sixth embodiments may be omitted or simplified.

Figure 19:
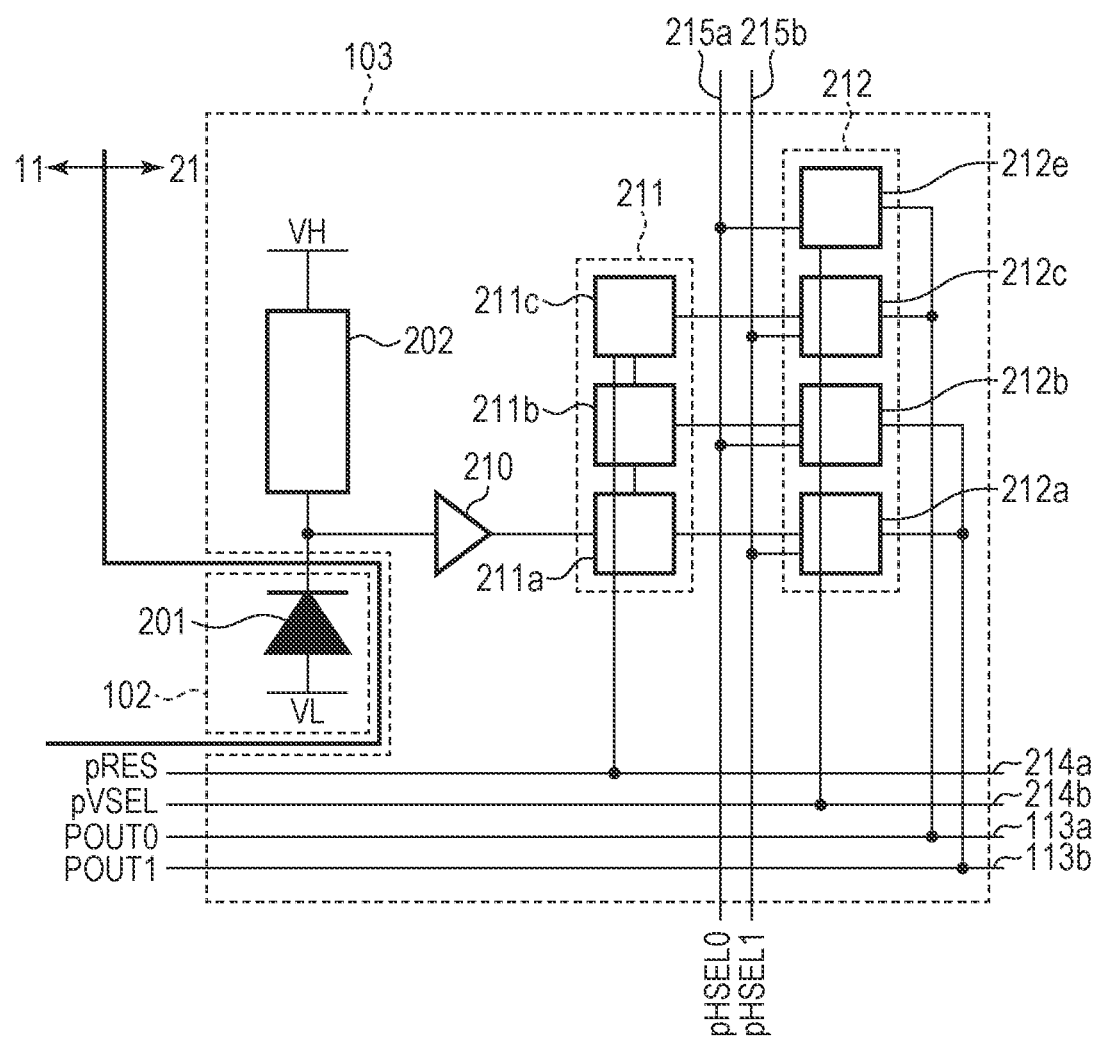
FIG. 19 is a schematic block diagram illustrating a configuration example of one pixel in a photoelectric conversion unit and a pixel signal processing unit according to a seventh embodiment.

FIG. 19 is a schematic block diagram illustrating a configuration example of one pixel of the photoelectric conversion unit 102 and the pixel signal processing unit 103 according to the present embodiment. The pixel signal processing unit 103 of the present embodiment differs from the configuration of FIG. 11 in that the third output circuit 212c and the dummy circuit 212e are connected to the pixel output signal line 113a, and the first output circuit 212a and the second output circuit 212b are connected to the pixel output signal line 113b.

The dummy circuit 212e is configured to output a dummy signal to the pixel output signal line 113a based on the control signal pHSEL0. The third output circuit 212c is configured to read the value of the third bit held in the third memory 211c based on the control signal pHSEL1 and output the value to the pixel output signal line 113a. That is, the pixel output signal line 113a is a common signal line for transmitting the third bit and the dummy signal.

The second output circuit 212b is configured to read the value of the second bit held in the second memory 211b based on the control signal pHSEL0 and output the read value to the pixel output signal line 113b. The first output circuit 212a is configured to read the value of the first bit held in the first memory 211a based on the control signal pHSEL1 and output the read value to the pixel output signal line 113b. That is, the pixel output signal line 113b is a common signal line for transmitting the second bit and the first bit.

Figure 20:
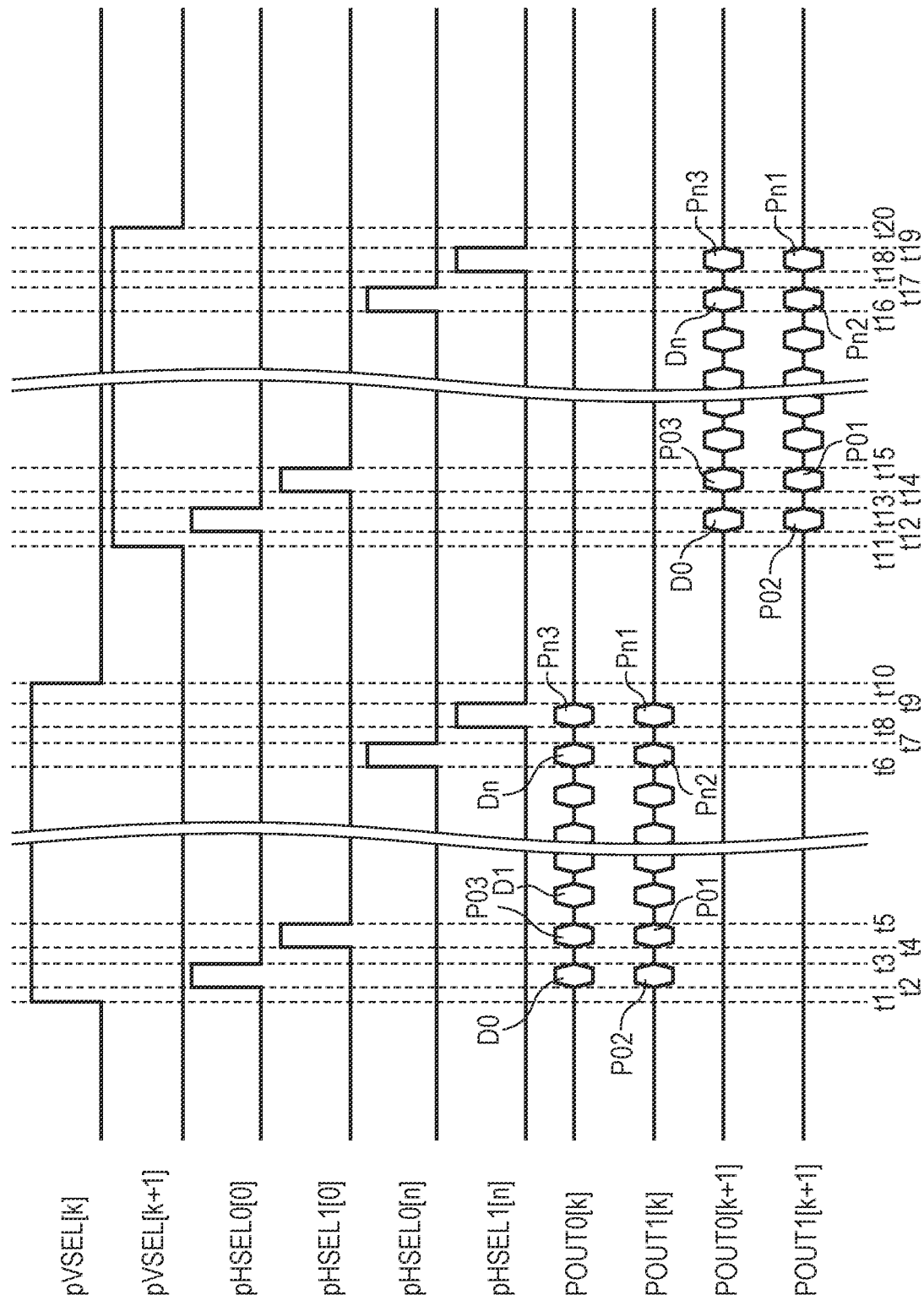
FIG. 20 is a timing chart illustrating the operation of the pixel signal processing unit according to the seventh embodiment.

FIG. 20 is a timing chart illustrating the operation of the pixel signal processing unit 103 according to the present embodiment. Description of the same operations as those in FIG. 13 will be omitted or simplified.

FIG. 20 differs from FIG. 13 in that the third bit and the dummy signal are commonly output to the pixel output signal line 113a, and the first bit and the second bit are commonly output to the pixel output signal line 113b. That is, from time t2 to time t3, the control signal pHSEL0[0] becomes the high level. Thus, the dummy circuit 212e in the k-th row and the 0-th column outputs the dummy signal D0 to the pixel output signal line 113a in the k-th row. The second output circuit 212b in the k-th row and in the 0-th column reads the value P02 of the second bit held in the second memory 211b and outputs the value P02 to the pixel output signal line 113b in the k-th row. Then, from time t4 to time t5, the control signal pHSEL1[0] becomes the high level. Thus, the third output circuit 212c in the k-th row and in the 0-th column reads the value P03 of the third bit held in the third memory 211c and outputs the value P03 to the pixel output signal line 113a in the k-th row. The first output circuit 212a in the k-th row and in the 0-th column reads the value P01 of the first bit held in the first memory 211a and outputs the value P01 to the pixel output signal line 113b in the k-th row. By outputting the third bit value P03 and the dummy signal D0 to one pixel output signal line 113a at different timings, the pixel output signal line 113a can be shared by the third bit value P03 and the dummy signal D0.

As described above, in the present embodiment, the third bit signal and the dummy signal in the digital signal held in the pixel signal processing unit 103 are commonly output to one pixel output signal line 113a. The effect of the third bit signal and the dummy signal being commonly output to one pixel output signal line will be described. When a signal is output via the pixel output signal line 113a, the bit value may be inverted from the originally output level due to external noise or the like received by the pixel output signal line 113a. Such inversion of the bit value greatly affects the image quality under a condition where the S/N ratio is small, particularly under a condition where the incident light is small. Further, when signals are sequentially output via the same pixel output signal line 113a, the output of a certain bit value may be influenced by the value of the bit output one bit before.

Therefore, as described in the third embodiment, a method is considered in which a dummy signal is read before a value of a bit which is desired to be prevented from being inverted due to noise or the like is read. For example, when the counter circuit 211 is a binary counter and there is no incident light, no pulse is output from the output terminal of the waveform shaping unit 210. Therefore, the third bit signal, the second bit signal, and the first bit signal are all at the low level, for example, when the third memory 211c, the second memory 211b, and the first memory 211a are reset by the control signal pRES.

In this state, a case where any one of the first to third bits is erroneously inverted from the low level to the high level due to the influence of noise will be considered. When the first bit, which is the least significant bit, is inverted, the value originally held by the counter circuit 211 (first digital signal) is 0 in the decimal number, whereas the output value (second digital signal) is an incorrect value of 1 in the decimal number. Similarly, the value (second digital signal) output when the second bit is inverted is 2 in a decimal number, and the value (second digital signal) output when the third bit which is the most significant bit is inverted is 4 in a decimal number. Thus, in the case where the value of any one bit is inverted, the influence when the third bit, which is the most significant bit, is inverted is greatest.

Therefore, in the present embodiment, the third bit signal which is the most significant bit and the dummy signal of the low level are commonly output to one pixel output signal line 113a. Since the reading of the low level dummy signal is performed before the reading of the third bit signal, even if the pixel output signal line 113a receives external noise or the like, the third bit is less likely to be inverted from the low level to the high level. Thus, according to the present embodiment, in addition to the effects of the first to third embodiments, the photoelectric conversion device 100 capable of reducing the influence of noise when the amount of incident light is small is provided.

Eighth Embodiment

Figure 21:
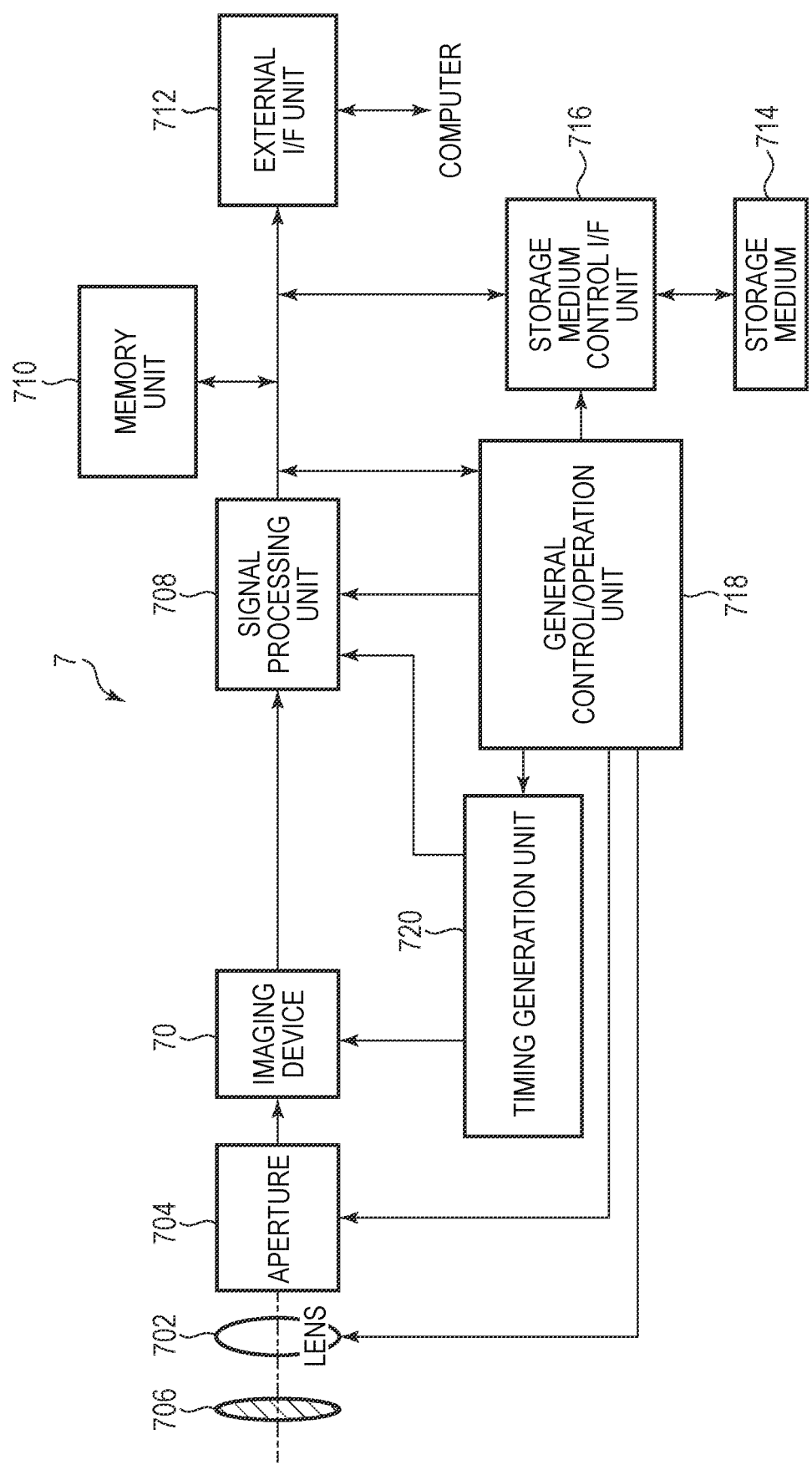
FIG. 21 is a block diagram of a photodetection system according to an eighth embodiment.

An imaging system according to an eighth embodiment of the present disclosure will be described with reference to FIG. 21. FIG. 21 is a block diagram of a photodetection system according to the present embodiment. The photodetection system according to the present embodiment is an imaging system that acquires an image based on incident light.

The photoelectric conversion device in the above-described embodiments can be applied to various imaging systems. Examples of the imaging system include a digital still camera, a digital camcorder, a camera head, a copier, a fax machine, a cellular phone, an in-vehicle camera, an observation satellite, and a surveillance camera. FIG. 21 is a block diagram of a digital still camera as an example of an imaging system.

The imaging system 7 illustrated in FIG. 21 includes a barrier 706, a lens 702, an aperture 704, an imaging device 70, a signal processing unit 708, a timing generation unit 720, a general control/operation unit 718, a memory unit 710, a storage medium control I/F unit 716, a storage medium 714, and an external I/F unit 712. The barrier 706 protects the lens, and the lens 702 forms an optical image of an object on the imaging device 70. The aperture 704 varies the amount of light passing through the lens 702. The imaging device 70 is configured like the photoelectric conversion device of the above embodiments, and converts an optical image formed by the lens 702 into image data. The signal processing unit 708 performs a process such as compression and various corrections of data on the imaging data output from the imaging device 70.

The timing generation unit 720 outputs various timing signals to the imaging device 70 and the signal processing unit 708. The general control/operation unit 718 controls the overall digital still camera, and the memory unit 710 temporarily stores image data. The storage medium control I/F unit 716 is an interface for recording or reading image data in or from the storage medium 714, and the storage medium 714 is a removable storage medium such as a semiconductor memory for recording or reading image data. The external I/F unit 712 is an interface for communicating with an external computer or the like. The timing signal or the like may be input from the outside of the imaging system 7, and the imaging system 7 may include at least the imaging device 70 and a signal processing unit 708 that processes the image signal output from the imaging device 70.

In the present embodiment, the imaging device 70 and the signal processing unit 708 may be formed on the same semiconductor substrate. In addition, the imaging device 70 and the signal processing unit 708 may be formed on different semiconductor substrates.

Each pixel of the imaging device 70 may include a first photoelectric conversion unit and a second photoelectric conversion unit. The signal processing unit 708 may process the pixel signal based on the charge generated in the first photoelectric conversion unit and the pixel signal based on the charge generated in the second photoelectric conversion unit, and acquire the distance information from the imaging device 70 to the object.

Ninth Embodiment

Figure 22:
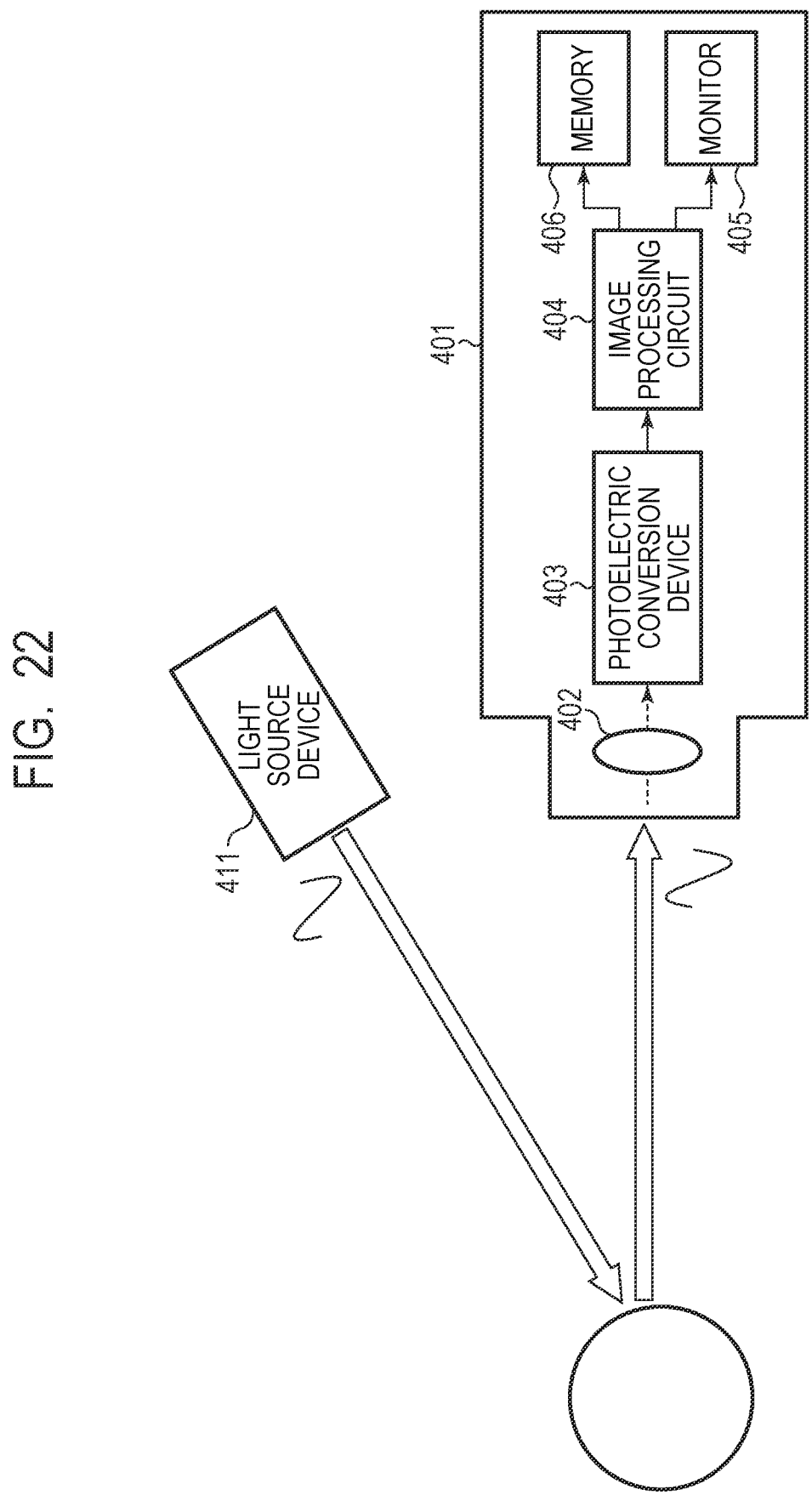
FIG. 22 is a block diagram of a photodetection system according to a ninth embodiment.

FIG. 22 is a block diagram of a photodetection system according to the present embodiment. More specifically, FIG. 22 is a block diagram of a ranging image sensor using the photoelectric conversion device according to the above-described embodiments.

As illustrated in FIG. 22, the ranging image sensor 401 includes an optical system 402, a photoelectric conversion device 403, an image processing circuit 404, a monitor 405, and a memory 406. The ranging image sensor 401 receives light (modulated light, pulsed light) emitted from the light source device 411 toward an object and reflected by the surface of the object. The ranging image sensor 401 can acquire a distance image corresponding to the distance to the object based on the time from light emission to light reception.

The optical system 402 includes one or a plurality of lenses, guides image light (incident light) from the object to the photoelectric conversion device 403, and forms an image on a light receiving surface (sensor portion) of the photoelectric conversion device 403.

As the photoelectric conversion device 403, the photoelectric conversion device of each of the above embodiments can be applied. The photoelectric conversion device 403 supplies a distance signal indicating a distance obtained from the received light signal to the image processing circuit 404.

The image processing circuit 404 performs image processing for forming a distance image based on the distance signal supplied from the photoelectric conversion device 403. The distance image (image data) obtained by image processing can be displayed on the monitor 405 and stored (recorded) in the memory 406.

By applying the photoelectric conversion device described above to the ranging image sensor 401 configured as described above, a more accurate distance image can be acquired.

Tenth Embodiment

The technology according to the present disclosure can be applied to various products. For example, techniques according to the present disclosure may be applied to endoscope surgery systems which is an example of the photodetection system.

Figure 23:
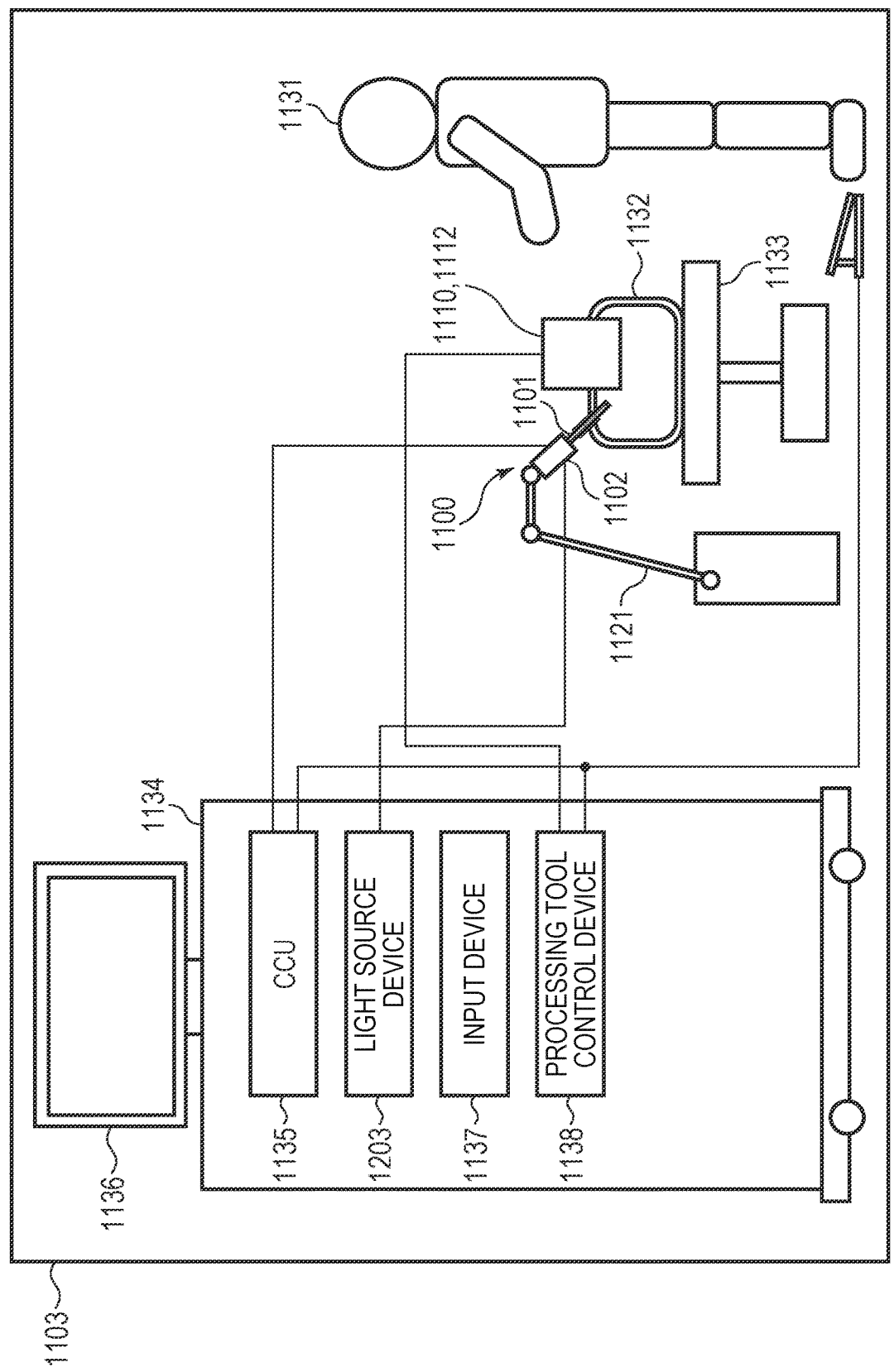
FIG. 23 is a schematic diagram of an endoscope surgery system according to a tenth embodiment.

FIG. 23 is a schematic view of an endoscope surgery system according to the present embodiment. FIG. 23 shows a state in which an operator (physician) 1131 performs surgery on a patient 1132 on a patient bed 1133 using the endoscope surgery system 1103. As shown, the endoscope surgery system 1103 includes an endoscope 1100, a surgery tool 1110, an arm 1121 and a cart 1134 on which various devices for endoscopic surgery are mounted.

The endoscope 1100 includes a lens barrel 1101 in which an area of a predetermined length from the distal end is inserted into the body cavity of the patient 1132, a camera head 1102 connected to the proximal end of the lens barrel 1101. Although FIG. 23 illustrates an endoscope 1100 configured as a so-called rigid scope having a rigid lens barrel 1101, the endoscope 1100 may be configured as a so-called flexible scope having a flexible lens barrel.

An opening into which an objective lens is fitted is provided at a distal end of the lens barrel 1101. A light source device 1203 is connected to the endoscope 1100. Light generated by the light source device 1203 is guided to the distal end of the barrel by a light guide extended inside the lens barrel 1101, and is irradiated toward an observation target in the body cavity of the patient 1132 via an objective lens. The endoscope 1100 may be a straight-viewing scope an oblique-viewing scope, or a side-viewing scope.

An optical system and a photoelectric conversion device are provided inside the camera head 1102, and reflected light (observation light) from an observation target is focused on the photoelectric conversion device by the optical system. The observation light is photoelectrically converted by the photoelectric conversion device, and an electric signal corresponding to the observation light, that is, an image signal corresponding to the observation image is generated. As the photoelectric conversion device, the photoelectric conversion device described in each of the above embodiments can be used. The image signal is transmitted to a camera control unit (CCU) 1135 as RAW data.

The CCU 1135 includes a central processing unit (CPU), a graphics processing unit (GPU), and the like, and controls overall operations of the endoscope 1100 and the display device 1136. Further, the CCU 1135 receives an image signal from the camera head 1102, and performs various kinds of image processing for displaying an image based on the image signal, such as development processing (demosaic processing).

The display device 1136 displays an image based on the image signal subjected to the image processing by the CCU 1135 under the control of the CCU 1135.

The light source device 1203 includes, for example, a light source such as a light emitting diode (LED), and supplies irradiation light to the endoscope 1100 when capturing an image of an operating part or the like.

The input device 1137 is an input interface to the endoscope surgery system 1103. The user can input various types of information and input instructions to the endoscope surgery system 1103 via the input device 1137.

The processing tool control device 1138 controls the actuation of the energy treatment tool 1112 for ablation of tissue, incision, sealing of blood vessels, etc.

The light source device 1203 is capable of supplying irradiation light to the endoscope 1100 when capturing an image of the surgical site, and may be, for example, a white light source formed by an LED, a laser light source, or a combination thereof. When a white light source is configured by a combination of RGB laser light sources, the output intensity and output timing of each color (each wavelength) can be controlled with high accuracy. Therefore, the white balance of the captured image can be adjusted in the light source device 1203. In this case, laser light from each of the RGB laser light sources may be irradiated onto the observation target in a time-division manner, and driving of the image pickup device of the camera head 1102 may be controlled in synchronization with the irradiation timing. Thus, images corresponding to R, G, and B can be captured in a time-division manner. According to this method, a color image can be obtained without providing a color filter in the image pickup device.

The driving of the light source device 1203 may be controlled such that the intensity of light output from the light source device 1203 is changed at predetermined time intervals. By controlling the driving of the image pickup device of the camera head 1102 in synchronization with the timing of changing the intensity of light to acquire an image in a time-division manner, and by synthesizing the images, it is possible to generate an image in a high dynamic range without so-called blackout and whiteout.

Further, the light source device 1203 may be configured to be able to supply light in a predetermined wavelength band corresponding to special light observation. In special light observation, for example, the wavelength dependence of light absorption in body tissue can be used. Specifically, a predetermined tissue such as a blood vessel in the surface layer of the mucosa is imaged with high contrast by irradiating light in a narrow band compared to the irradiation light (i.e., white light) during normal observation. Alternatively, in special light observation, fluorescence observation for obtaining an image by fluorescence generated by irradiation with excitation light may be performed. In the fluorescence observation, excitation light can be irradiated to the body tissue to observe fluorescence from the body tissue, or a reagent such as indocyanine green (ICG) can be locally injected into the body tissue and the body tissue can be irradiated with excitation light corresponding to the fluorescence wavelength of the reagent to obtain a fluorescence image. The light source device 1203 may be configured to be able to supply narrowband light and/or excitation light corresponding to such special light observation.

Eleventh Embodiment

The photodetection system and the movable body of the present embodiment will be described with reference to FIGS. 24, 25A, 25B, 25C, and 26. In the present embodiment, an example of an in-vehicle camera is illustrated as a photodetection system.

Figure 24:
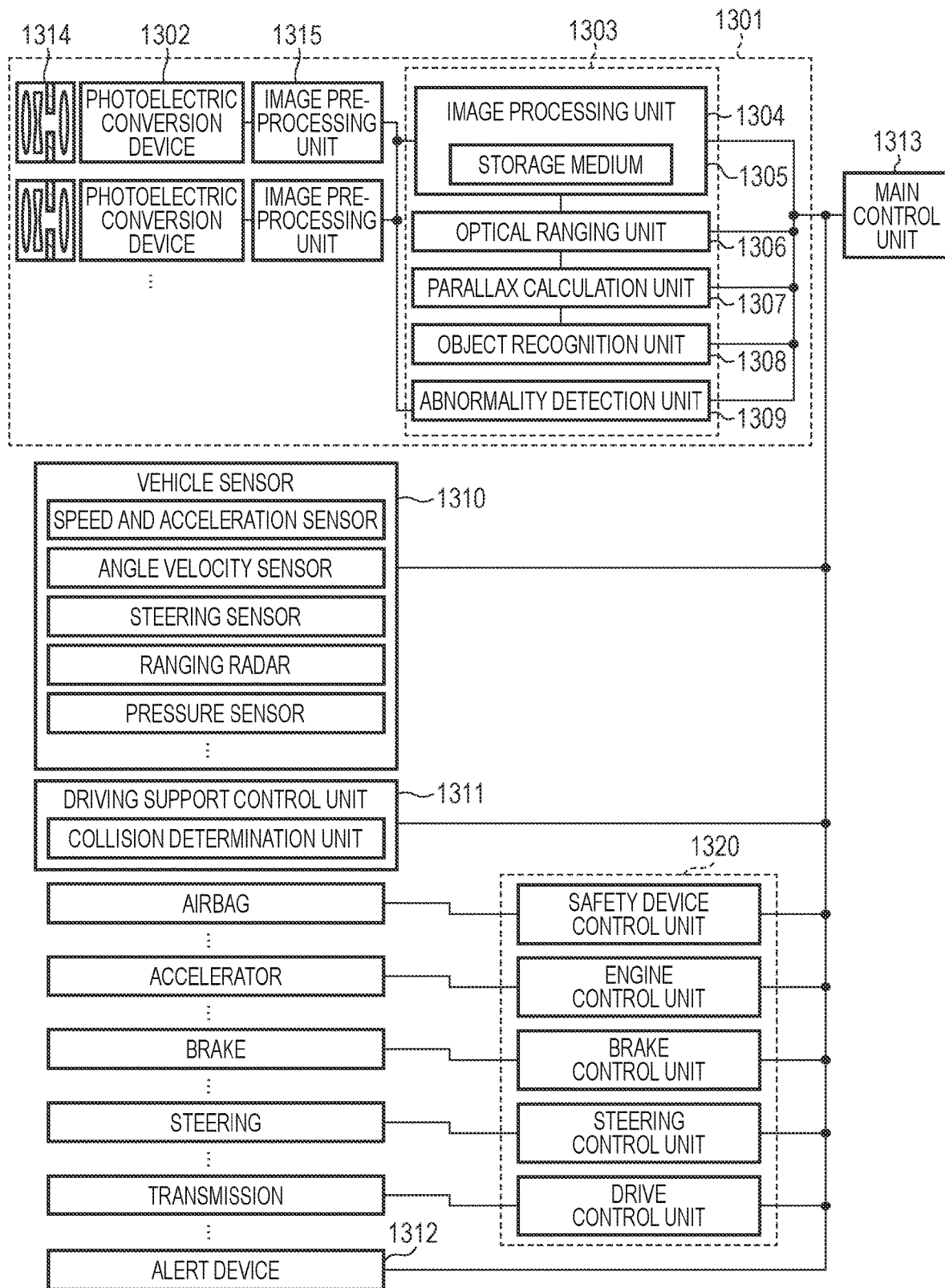
FIG. 24 is a schematic diagram of a photodetection system according to an eleventh embodiment.

FIG. 24 is a schematic diagram of a photodetection system according to the present embodiment, illustrating an example of a vehicle system and a photodetection system mounted on the vehicle system. The photodetection system 1301 includes a photoelectric conversion device 1302, an image pre-processing unit 1315, an integrated circuit 1303, and an optical system 1314. The optical system 1314 forms an optical image of an object on the photoelectric conversion device 1302. The photoelectric conversion device 1302 converts the optical image of the object formed by the optical system 1314 into an electric signal. The photoelectric conversion device 1302 is any one of the photoelectric conversion devices according to the above embodiments. The image pre-processing unit 1315 performs predetermined signal processing on the signal output from the photoelectric conversion device 1302. The function of the image pre-processing unit 1315 may be incorporated in the photoelectric conversion device 1302. The photodetection system 1301 includes at least two sets of an optical system 1314, a photoelectric conversion device 1302, and an image pre-processing unit 1315, and outputs from the image pre-processing unit 1315 of each set are input to the integrated circuit 1303.

The integrated circuit 1303 is an integrated circuit for use in an imaging system, and includes an image processing unit 1304 including a storage medium 1305, an optical ranging unit 1306, a parallax calculation unit 1307, an object recognition unit 1308, and an abnormality detection unit 1309. The image processing unit 1304 performs image processing such as development processing and defect correction on the output signal of the image pre-processing unit 1315. The storage medium 1305 stores the primary storage of the captured image and the defect position of the captured pixel. An optical ranging unit 1306 focuses the object and measures distance. The parallax calculation unit 1307 calculates distance measurement information from the plurality of image data acquired by the plurality of photoelectric conversion devices 1302. The object recognition unit 1308 recognizes an object such as a vehicle, a road, a sign, or a person. When the abnormality detection unit 1309 detects an abnormality of the photoelectric conversion device 1302, the abnormality detection unit 1309 issues an abnormality to the main control unit 1313.

The integrated circuit 1303 may be realized by dedicated hardware, a software module, or a combination thereof. It may be realized by a field programmable gate array (FPGA), an application specific integrated circuit (ASIC), or the like, or may be realized by a combination of these.

The main control unit 1313 controls overall operations of the photodetection system 1301, the vehicle sensor 1310, the control unit 1320, and the like. Without the main control unit 1313, the photodetection system 1301, the vehicle sensor 1310, and the control unit 1320 may individually have a communication interface, and each may send and receive control signals via a communication network, for example, according to the CAN standard.

The integrated circuit 1303 has a function of transmitting a control signal or a setting value to the photoelectric conversion device 1302 by receiving a control signal from the main control unit 1313 or by its own control unit.

The photodetection system 1301 is connected to the vehicle sensor 1310, and can detect a traveling state of the host vehicle such as a vehicle speed, a yaw rate, and a steering angle, an environment outside the host vehicle, and states of other vehicles and obstacles. The vehicle sensor 1310 is also a distance information acquisition unit that acquires distance information to an object. The photodetection system 1301 is connected to a driving support control unit 1311 that performs various driving assist functions such as automatic steering, automatic cruise, and collision prevention function. In particular, regarding the collision determination function, the photodetection system 1301 determines the presence or absence of collision with another vehicle or obstacle based on the detection result of the vehicle sensor 1310. Thus, it is possible to execute the avoidance control when collision is estimated and the start-up control of the safety device when collision occurred.

The photodetection system 1301 is also connected to an alert device 1312 that issues an alarm to the driver based on the determination result of the collision determination unit. For example, when the possibility of collision is high as the determination result of the collision determination unit, the main control unit 1313 performs vehicle control such as applying a brake, returning an accelerator, and suppressing engine output, thereby realizing avoidance of collision and reduction of damage. The alert device 1312 issues an alarm to the user by using means such as an alarm of a sound or the like, a display of alarm information on a display unit screen such as a car navigation system and a meter panel, and a vibration application to a seatbelt and a steering wheel.

Figure 25A:
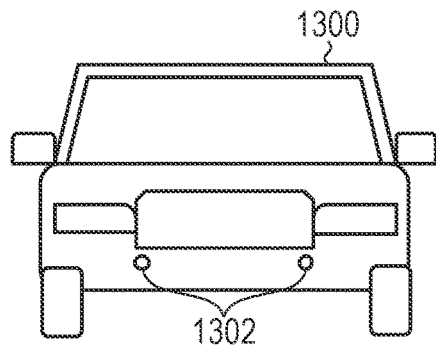
FIGS. 25A, 25B, and 25C are schematic diagrams of a movable body according to the eleventh embodiment.
Figure 25B:
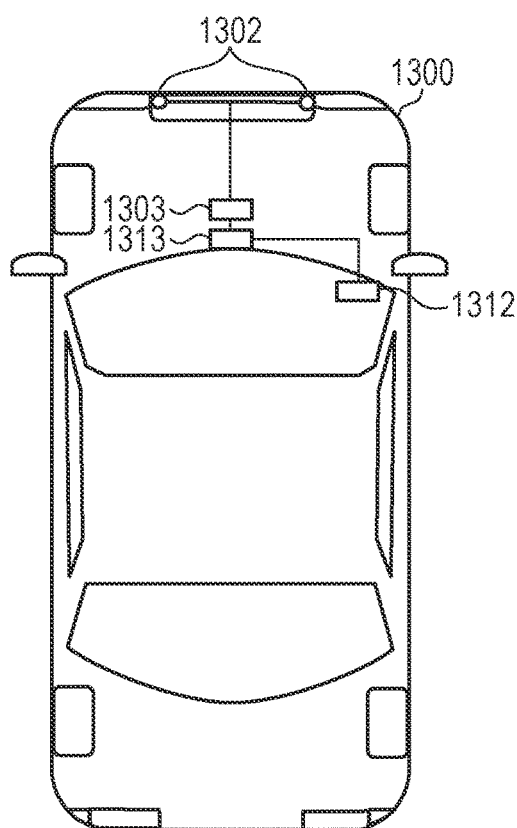
Figure 25C:
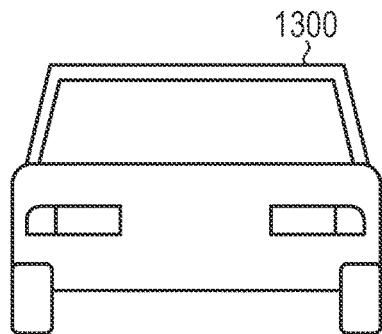

The photodetection system 1301 in the present embodiment is capable of capturing an image of the periphery of the vehicle, for example, the front or the rear. FIGS. 25A, 25B and 25C are schematic diagrams of a movable body according to the present embodiment, illustrating a configuration in which an image of the front of the vehicle is captured by the photodetection system 1301.

The two photoelectric conversion devices 1302 are disposed in front of the vehicle 1300. Specifically, it is preferable that the center line with respect to the forward/back direction or the outer shape (for example, the vehicle width) of the vehicle 1300 be regarded as the axis of symmetry, and the two photoelectric conversion devices 1302 be arranged in line symmetry with respect to the axis of symmetry. This makes it possible to acquire distance information between the vehicle 1300 and the object and to determine the possibility of collision. The photoelectric conversion device 1302 is preferably disposed at a position where the driver does not interfere with the field of view of the driver when the driver visually recognizes the situation outside the vehicle 1300 from the driver's seat. The alert device 1312 is preferably disposed at a position that is easy to enter the field of view of a driver.

Figure 26:
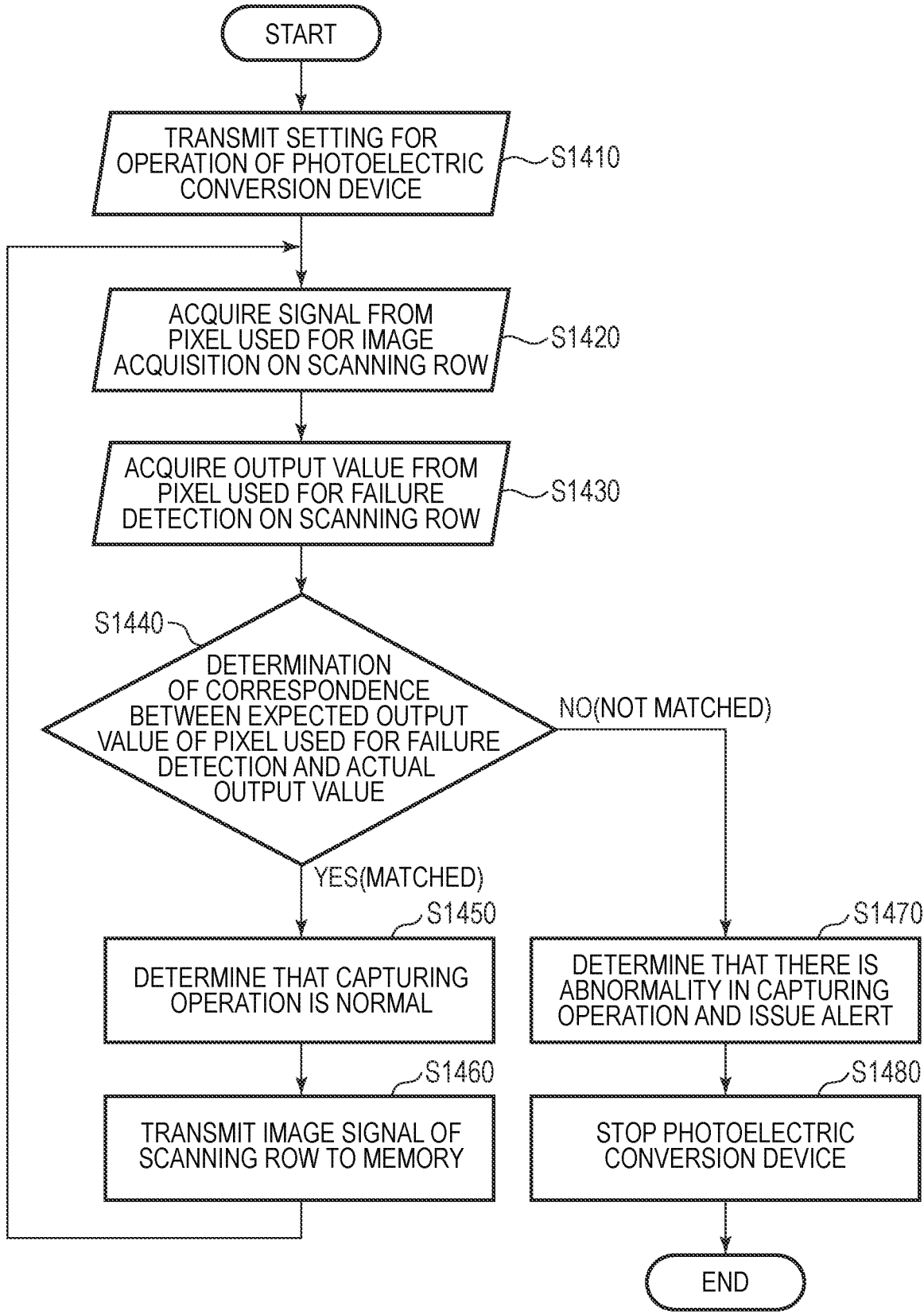
FIG. 26 is a flowchart illustrating an operation of the optical detection system according to the eleventh embodiment.

Next, a failure detection operation of the photoelectric conversion device 1302 in the photodetection system 1301 will be described with reference to FIG. 26. FIG. 26 is a flowchart illustrating the operation of the photodetection system according to the present embodiment. The failure detection operation of the photoelectric conversion device 1302 may be executed according to steps S1410 to S1480 illustrated in FIG. 26.

In step S1410, setting at the time of startup of the photoelectric conversion device 1302 is performed. That is, setting information for the operation of the photoelectric conversion device 1302 is transmitted from the outside of the photodetection system 1301 (for example, the main control unit 1313) or from the inside of the photodetection system 1301, and the photoelectric conversion device 1302 starts the imaging operation and the failure detection operation.

Next, in step S1420, the photoelectric conversion device 1302 acquires a pixel signal from the effective pixel. In step S1430, the photoelectric conversion device 1302 acquires an output value from a failure detection pixel provided for failure detection. The failure detection pixel includes a photoelectric conversion element in the same manner as the effective pixel. A predetermined voltage is written into the photoelectric conversion element. The failure detection pixel outputs a signal corresponding to the voltage written in the photoelectric conversion element. Note that steps S1420 and S1430 may be executed in reverse order.

Next, in step S1440, the photodetection system 1301 performs the determination of correspondence between the expected output value of the failure detection pixel and the actual output value from the failure detection pixel. If it is determined in step S1440 that the expected output value matches the actual output value, the photodetection system 1301 proceeds to step S1450, determines that the capturing operation is normally performed, and proceeds to step S1460. In step S1460, the photodetection system 1301 transmits the pixel signal of the scanning row to the storage medium 1305 and temporarily stores the pixel signal. Thereafter, the photodetection system 1301 returns to the process of step S1420 to continue the failure detection operation. On the other hand, if the expected output value and the actual output value do not match as a result of the determination in step S1440, the photodetection system 1301 proceeds to the process of step S1470. In step S1470, the photodetection system 1301 determines that there is an abnormality in the capturing operation, and issues an alarm to the main control unit 1313 or the alert device 1312. The alert device 1312 displays that an abnormality has been detected on the display unit. Thereafter, in step S1480, the photodetection system 1301 stops the photoelectric conversion device 1302 and ends the operation of the photodetection system 1301.

In the present embodiment, the flowchart that is repeated for each row is exemplified, but the flowchart may be repeated for each plurality of rows, or the failure detection operation may be performed for each frame. The alarm in step S1470 may be notified to the outside of the vehicle via the wireless network.

Further, in the present embodiment, the control in which the vehicle does not collide with another vehicle has been described, but the disclosure is also applicable to a control in which the vehicle is automatically driven following another vehicle, a control in which the vehicle is automatically driven so as not to protrude from the lane, and the like. Further, the photodetection system 1301 can be applied not only to a vehicle such as a host vehicle, but also to a movable body (movable machinery) such as a ship, an aircraft, or an industrial robot. In addition, the disclosure can be applied not only to a movable body but also to an apparatus using object recognition in a wide range such as an intelligent transport systems (ITS).

The photoelectric conversion device of the present disclosure may further have a configuration capable of acquiring various kinds of information such as distance information.

Twelfth Embodiment

Figure 27A:
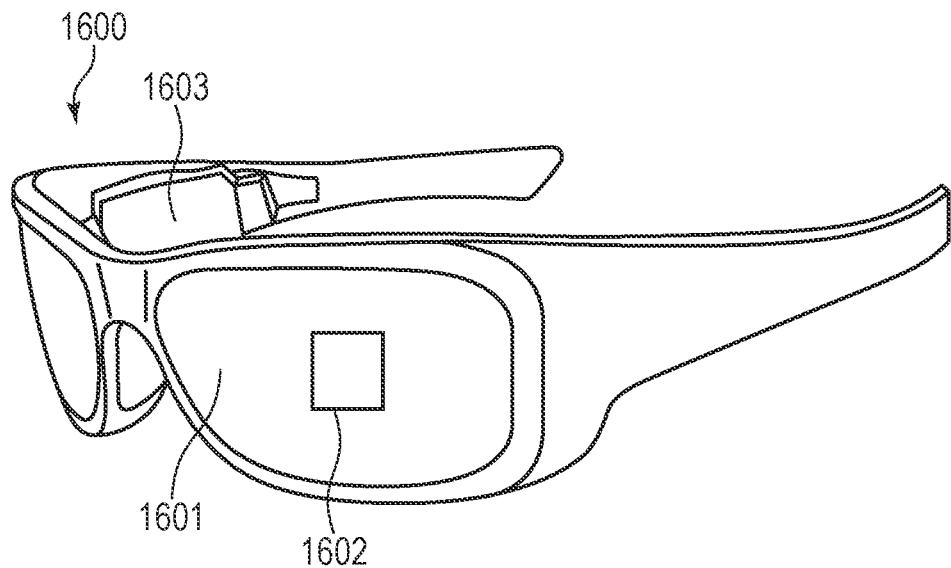
FIGS. 27A and 27B are diagrams illustrating specific examples of the electronic apparatus according to the twelfth embodiment.

FIG. 27A is a diagram illustrating a specific example of an electronic apparatus in the present embodiment, and shows eyeglasses 1600 (smartglasses). The eyeglasses 1600 are provided with the photoelectric conversion device 1602 described in each of the above embodiments. That is, the eyeglasses 1600 is an example of the photodetection system to which the photoelectric conversion device 1602 described any one of above-described embodiments can be applied. A display device including a light-emitting device such as an OLED or an LED may be provided on the back surface side of the above-described lens 1601. One photoelectric conversion device 1602 or a plurality of photoelectric conversion devices 1602 may be provided. A plurality of types of photoelectric conversion devices may be combined. The arrangement position of the photoelectric conversion device 1602 is not limited to that shown in FIG. 27A.

The eyeglasses 1600 further comprises a control device 1603. The control device 1603 functions as a power source for supplying power to the photoelectric conversion device 1602 and the display device. The control device 1603 controls operations of the photoelectric conversion device 1602 and the display device. An optical system for focusing light on the photoelectric conversion device 1602 is formed in the lens 1601.

Figure 27B:
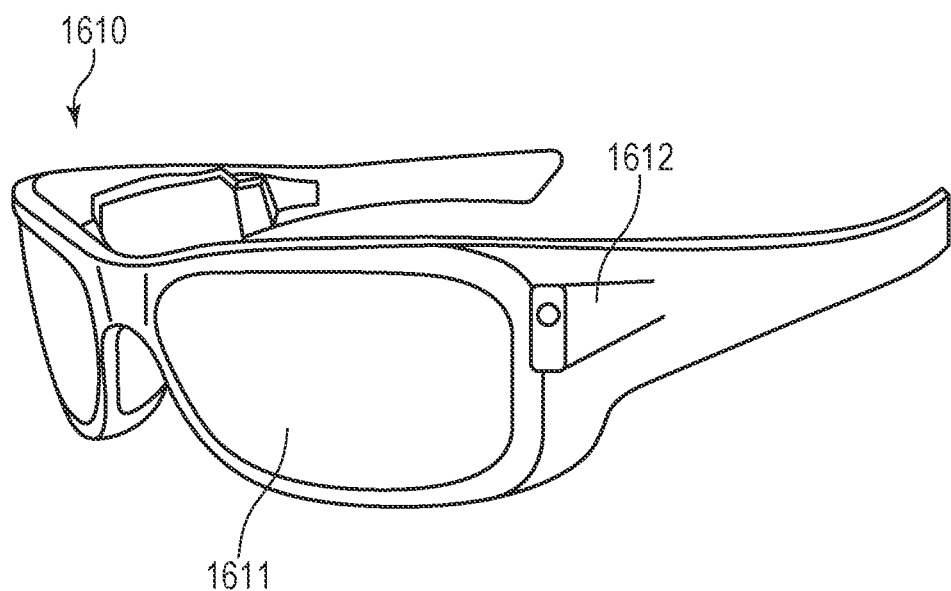

FIG. 27B illustrates eyeglasses 1610 (smartglasses) according to one embodiment. The eyeglasses 1610 include a control device 1612, and a photoelectric conversion device corresponding to the photoelectric conversion device 1602 and a display device are mounted on the control device 1612. A photoelectric conversion device in the control device 1612 and an optical system for projecting light emitted from the display device are formed on the lens 1611, and an image is projected on the lens 1611. The control device 1612 functions as a power source for supplying power to the photoelectric conversion device and the display device, and controls the operation of the photoelectric conversion device and the display device. The control device 1612 may include a line-of-sight detection unit that detects a line-of-sight of the user. Infrared rays may be used to detect the line-of-sight. The infrared light emitting section emits infrared light to the eyeball of the user who is looking at the display image. A captured image of the eyeball is obtained by detecting reflected light of the emitted infrared light from the eyeball by an imaging unit having a light receiving element. The reduction means for reducing light from the infrared light emitting unit to the display unit in a plan view is provided, thereby reducing deterioration in image quality.

The control device 1612 detects the line-of-sight of the user with respect to the display image by using image of the eyeball acquired by capturing infrared light. Any known method can be applied to line-of-sight detection using a captured image of an eyeball. As an example, a line-of-sight detection method based on a Purkinje image caused by reflection of irradiation light on the cornea can be used.

More specifically, line-of-sight detection processing based on the pupil cornea reflection method is performed. A line-of-sight of the user is detected by calculating a line-of-sight vector representing the direction (rotation angle) of the eyeball based on the pupil image and the Purkinje image included in the captured image of the eyeball using the pupil cornea reflection method.

The display device of the present embodiment may include a photoelectric conversion device having a light receiving element, and may control a display image of the display device based on line-of-sight information of a user from the photoelectric conversion device.

Specifically, the display device determines, based on the line-of-sight information, a first view area to be gazed by a user and a second view area other than the first view area. The first view area and the second view area may be determined by a control device of the display device, or may be determined by an external control device. In the display area of the display device, the display resolution of the first view area may be controlled to be higher than the display resolution of the second view area. That is, the resolution of the second view area may be lower than that of the first view area.

The display area may include a first display area and a second display area different from the first display area. An area having a high priority may be determined from the first display area and the second display area based on the line-of-sight information. The first view area and the second view area may be determined by a control device of the display device, or may be determined by an external control device. The resolution of the high priority area may be controlled to be higher than the resolution of the areas other than the high priority area. That is, the resolution of an area having a relatively low priority can be lowered.

Note that an artificial intelligence (AI) may be used to determine the first view area and the high priority area. The AI may be a model configured to estimate an angle of a line-of-sight and a distance to a target object ahead of the line-of-sight from an image of an eyeball and a direction in which the eyeball of the image is actually viewed as teacher data. The AI program may be provided in either the display device or the photoelectric conversion device, or may be provided in an external device. When the external apparatus has an AI program, it can be transmitted from a server or the like to a display apparatus via communication.

When the display control is performed based on the visual recognition, the present embodiment can be preferably applied to smartglasses further including a photoelectric conversion device for capturing an image of the outside. The smartglasses can display the captured external information in real time.

Other Embodiments

The disclosure is not limited to the above-described embodiments, and various modifications are possible. For example, an example in which a configuration of a part of any embodiment is added to another embodiment or an example in which a configuration of a part of any embodiment is replaced with another embodiment is also an embodiment of the disclosure.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-008584, filed Jan. 22, 2021, and Japanese Patent Application No. 2021-171595, filed Oct. 20, 2021 which are hereby incorporated by reference herein in their entirety.

What is claimed is:

1. A signal processing device comprising:
a plurality of pixel signal processing units arranged in a first direction and a second direction, each of the plurality of signal processing units acquiring a digital signal having a plurality of bits based on an output from a corresponding avalanche photodiode; and
a signal line group arranged corresponding to the plurality of pixel signal processing units arranged in the first direction and including a signal line to which a plurality of signals corresponding to a plurality of bits of different digits of the digital signal held in each of the plurality of pixel signal processing units arranged in the first direction are output in common, wherein each of the plurality of pixel signal processing units includes a counter circuit that acquires the digital signal by counting the number of pulses output from a corresponding avalanche photodiode and an output circuit that reads a value of each of the plurality of bits from the counter circuit and outputs the read values to the signal line, wherein the output circuit outputs each of the plurality of signals corresponding to the plurality of bits to the signal line at different timings, wherein the digital signal includes a first bit, a second bit, a third bit and a fourth bit, that are four consecutive digits in this order, and wherein the signal line group includes a first signal line to which a signal corresponding to the first bit and a signal corresponding to the fourth bit are output in common and a second signal line to which a signal corresponding to the second bit and a signal corresponding to the third bit are output in common.

2. The signal processing device according to claim 1, wherein the output circuit selectively reads a value of any of the plurality of bits and outputs the read value to the signal line.

3. The signal processing device according to claim 1, wherein in a period in which each of the plurality of signals corresponding to the plurality of bits is output from the output circuit to the signal line, a reset operation is performed by applying a predetermined potential to the signal line between a time when a signal corresponding to one bit of the plurality of bits is output and a time when a signal corresponding to another bit of the plurality of bits is output.

4. The signal processing device according to claim 1, wherein the output circuit is an open drain buffer circuit including a plurality of transistors.

5. The signal processing device according to claim 4, wherein the plurality of transistors is formed in a common active region.

6. The signal processing device according to claim 4, wherein the plurality of transistors is connected to a common ground wiring.

7. The signal processing device according to claim 1, wherein the counter circuit includes a first memory holding the first bit, a second memory holding the second bit, a third memory holding the third bit, and a fourth memory holding the fourth bit, wherein the first memory and the second memory are arranged adjacent to each other in the second direction, wherein the second memory and the third memory are arranged adjacent to each other in the first direction, wherein the fourth memory and the third memory are arranged adjacent to each other in the second direction, and wherein the first memory and the fourth memory are arranged adjacent to each other in the first direction.

8. The signal processing device according to claim 7 further comprising a first output circuit reading the first bit from the counter circuit, a second output circuit reading the second bit from the counter circuit, a third output circuit reading the third bit from the counter circuit and a fourth output circuit reading the fourth bit from the counter circuit, wherein the first output circuit and the second output circuit are arranged adjacent to each other in the second direction, wherein the second output circuit and the third output circuit are arranged adjacent to each other in the first direction, wherein the fourth output circuit and the third output circuit are arranged adjacent to each other in the second direction, and wherein the first output circuit and the fourth output circuit are arranged adjacent to each other in the first direction.

9. The signal processing device according to claim 8, wherein a positional relationship in a plan view of the first memory, the second memory, the third memory, and the fourth memory is the same as a positional relationship in the plan view of the first output circuit, the second output circuit, the third output circuit, and the fourth output circuit.

10. The signal processing device according to claim 1, wherein the signal line group includes a signal line to which a plurality of signals based on two pixel signal processing units adjacent in the second direction are output in common.

11. A photoelectric conversion device comprising:
a plurality of avalanche photodiodes; and
the signal processing device according to claim 1 that processes a signal output from each of the plurality of avalanche photodiodes.

12. The photoelectric conversion device according to claim 11,
wherein the plurality of avalanche photodiodes is arranged on a first substrate, and
wherein the signal processing device is arranged on a second substrate stacked with the first substrate.

13. A photodetection system comprising:
the photoelectric conversion device according to claim 11;
a signal processing unit that processes a signal output form the photoelectric conversion device.

14. A movable body comprising:
the photoelectric conversion device according to claim 11;
a distance information acquisition unit that acquires distance information to an object from a signal output from the photoelectric conversion device; and
a control unit that controls the movable body based on the distance information.

15. A signal processing device comprising:
a plurality of pixel signal processing units arranged in a first direction and a second direction, each of the plurality of signal processing units acquiring a digital signal having a plurality of bits based on an output from a corresponding avalanche photodiode;
a signal line group arranged corresponding to the plurality of pixel signal processing units arranged in the first direction and including a signal line to which a plurality of signals corresponding to a plurality of bits of different digits of the digital signal held in each of the plurality of pixel signal processing units arranged in the first direction are output in common; and
a dummy circuit that outputs a dummy signal to one signal line of the signal line group.

16. The signal processing device according to claim 15, wherein the number of bits included in the digital signal is an odd number, and
wherein the signal line group includes a signal line to which a signal corresponding to one bit of the digital signal and the dummy signal are output in common.

17. The signal processing device according to claim 15, wherein a value of the dummy signal is the same as a value of a bit output next to the dummy signal in a case where a pulse is not output from the avalanche photodiode.

18. The signal processing device according to claim 15, wherein a bit to be output next to the dummy signal to a signal line to which a signal corresponding to one bit of the digital signal and the dummy signal are output in common is a bit in which a difference between a first digital signal held by the counter circuit in a case where a pulse is not output from the avalanche photodiode and a second digital signal acquired by inverting any one bit of the first digital is the largest.

19. The signal processing device according to claim 15, wherein the signal processing device further comprising a common output circuit that reads a value of each of the plurality bits from each of the counter circuit of the two pixel signal processing unit adjacent each other in the first direction or the second direction and output the read value.

20. A signal processing device comprising:
a plurality of pixel signal processing units arranged in a first direction and a second direction, each of the plurality of signal processing units acquiring a digital signal having a plurality of bits based on an output from a corresponding avalanche photodiode and a counter circuit that acquires the digital signal by counting the number of pulses output from a corresponding avalanche photodiode; and
a signal line group arranged corresponding to the plurality of pixel signal processing units arranged in the first direction and including a signal line to which a plurality of signals corresponding to a plurality of bits of different digits of the digital signal held in each of the plurality of pixel signal processing units arranged in the first direction are output in common,
wherein the digital signal includes a first bit, a second bit, a third bit and a fourth bit, that are four consecutive digits in this order,
wherein the signal line group includes a first signal line to which a signal corresponding to the first bit and a signal corresponding to the fourth bit are output in common and a second signal line to which a signal corresponding to the second bit and a signal corresponding to the third bit are output in common,
wherein the counter circuit includes a first memory holding the first bit, a second memory holding the second bit, a third memory holding the third bit, and a fourth memory holding the fourth bit,
wherein the first memory and the second memory are arranged adjacent to each other in the second direction,
wherein the second memory and the third memory are arranged adjacent to each other in the first direction,
wherein the fourth memory and the third memory are arranged adjacent to each other in the second direction, and
wherein the first memory and the fourth memory are arranged adjacent to each other in the first direction.

21. The signal processing device according to claim 20 further comprising a first output circuit reading the first bit from the counter circuit, a second output circuit reading the second bit from the counter circuit, a third output circuit reading the third bit from the counter circuit and a fourth output circuit reading the fourth bit from the counter circuit,
wherein the first output circuit and the second output circuit are arranged adjacent to each other in the second direction,
wherein the second output circuit and the third output circuit are arranged adjacent to each other in the first direction,
wherein the fourth output circuit and the third output circuit are arranged adjacent to each other in the second direction, and
wherein the first output circuit and the fourth output circuit are arranged adjacent to each other in the first direction.

22. The signal processing device according to claim 21, wherein a positional relationship in a plan view of the first memory, the second memory, the third memory, and the fourth memory is the same as a positional relationship in the plan view of the first output circuit, the second output circuit, the third output circuit, and the fourth output circuit.

23. The signal processing device according to claim 22, wherein the first signal line and the second signal line extend along the first direction in a plan view.

24. A signal processing device comprising:
a plurality of pixel signal processing units arranged in a first direction and a second direction, each of the plurality of signal processing units acquiring a digital signal having a plurality of bits based on an output from a corresponding photoelectric conversion unit and a counter circuit that acquires the digital signal by counting the number of pulses output from a corresponding photoelectric conversion unit; and
a signal line group arranged corresponding to the plurality of pixel signal processing units arranged in the first direction and including a signal line to which a plurality of signals corresponding to a plurality of bits of different digits of the digital signal held in each of the plurality of pixel signal processing units arranged in the first direction are output in common,
wherein each of the plurality of pixel signal processing units includes an output circuit that reads a value of each of the plurality of bits from the counter circuit and outputs the read values to the signal line,
wherein the digital signal includes a first bit, a second bit, a third bit and a fourth bit, that are four consecutive digits in this order,
wherein the signal line group includes a first signal line to which a signal corresponding to the first bit and a signal corresponding to the fourth bit are output in common and a second signal line to which a signal corresponding to the second bit and a signal corresponding to the third bit are output in common, and
wherein the output circuit outputs each of the plurality of signals corresponding to the plurality of bits to the signal line at different timings.

25. The signal processing device according to claim 24, wherein the counter circuit includes a first memory holding the first bit, a second memory holding the second bit, a third memory holding the third bit, and a fourth memory holding the fourth bit,
wherein the first memory and the second memory are arranged adjacent to each other in the second direction,
wherein the second memory and the third memory are arranged adjacent to each other in the first direction,
wherein the fourth memory and the third memory are arranged adjacent to each other in the second direction, and
wherein the first memory and the fourth memory are arranged adjacent to each other in the first direction.

26. The signal processing device according to claim 25 further comprising a first output circuit reading the first bit from the counter circuit, a second output circuit reading the second bit from the counter circuit, a third output circuit reading the third bit from the counter circuit and a fourth output circuit reading the fourth bit from the counter circuit, wherein the first output circuit and the second output circuit are arranged adjacent to each other in the second direction, wherein the second output circuit and the third output circuit are arranged adjacent to each other in the first direction, wherein the fourth output circuit and the third output circuit are arranged adjacent to each other in the second direction, and wherein the first output circuit and the fourth output circuit are arranged adjacent to each other in the first direction.

27. The signal processing device according to claim 26, wherein a positional relationship in a plan view of the first memory, the second memory, the third memory, and the fourth memory is the same as a positional relationship in the plan view of the first output circuit, the second output circuit, the third output circuit, and the fourth output circuit.

\* \* \* \* \*